(12) United States Patent
Suzuki et al.

(10) Patent No.: US 8,846,436 B2
(45) Date of Patent: Sep. 30, 2014

(54) SEMICONDUCTOR DEVICE MANUFACTURING METHOD FOR FORMING AN OPENING TO PROVIDE A PLUG

(75) Inventors: Kentaro Suzuki, Kawasaki (JP); Takehito Okabe, Atsugi (JP); Hiroaki Sano, Machida (JP); Junji Iwata, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 190 days.

(21) Appl. No.: 13/366,577

(22) Filed: Feb. 6, 2012

(65) Prior Publication Data

US 2012/0202312 A1 Aug. 9, 2012

(30) Foreign Application Priority Data

Feb. 9, 2011 (JP) ................................. 2011-026355

(51) Int. Cl.
*H01L 21/00* (2006.01)
*H01L 27/146* (2006.01)

(52) U.S. Cl.
CPC .... *H01L 27/14687* (2013.01); *H01L 27/14685* (2013.01); *H01L 27/14623* (2013.01); *H01L 27/14621* (2013.01)
USPC 438/73; 438/675; 257/E27.135; 257/E31.113; 257/E21.586

(58) Field of Classification Search
CPC .................. H01L 27/14687; H01L 27/14685; H01L 27/14621; H01L 27/14623
USPC ................... 257/E27.135, E31.113, E21.586; 438/73, 675
See application file for complete search history.

(56) References Cited

U.S. PATENT DOCUMENTS

| 4,876,164 | A | * | 10/1989 | Watakabe et al. | 430/5 |
| 7,442,973 | B2 | * | 10/2008 | Komoguchi et al. | 257/291 |
| 2007/0122935 | A1 | | 5/2007 | Kasano et al. | |
| 2010/0007779 | A1 | * | 1/2010 | Nakata et al. | 348/294 |
| 2010/0025571 | A1 | * | 2/2010 | Toumiya et al. | 250/208.1 |
| 2011/0024858 | A1 | * | 2/2011 | Yoshihara et al. | 257/432 |

FOREIGN PATENT DOCUMENTS

| CN | 1745478 A | 3/2006 |
| CN | 101197386 A | 6/2008 |
| JP | 2002-057318 A | 2/2002 |
| JP | 2010-103458 A | 5/2010 |

* cited by examiner

*Primary Examiner* — Kimberly Rizkallah
*Assistant Examiner* — Alexander Belousov
(74) *Attorney, Agent, or Firm* — Canon USA, Inc. IP Division

(57) ABSTRACT

An interlayer insulating film is disposed above an image pickup region and a peripheral region of the semiconductor substrate. An opening is formed in the interlayer insulating film at a position overlying a photoelectric conversion portion. A waveguide member is formed above the image pickup region and the peripheral region of the semiconductor substrate. A part of the waveguide member, which part is disposed above the peripheral region, is removed such that the interlayer insulating film is exposed.

17 Claims, 11 Drawing Sheets

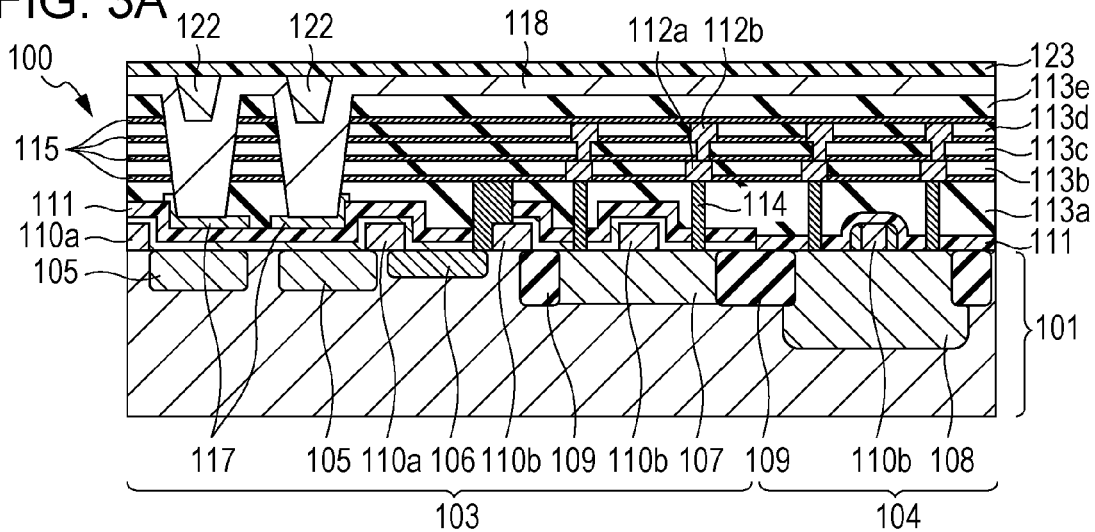
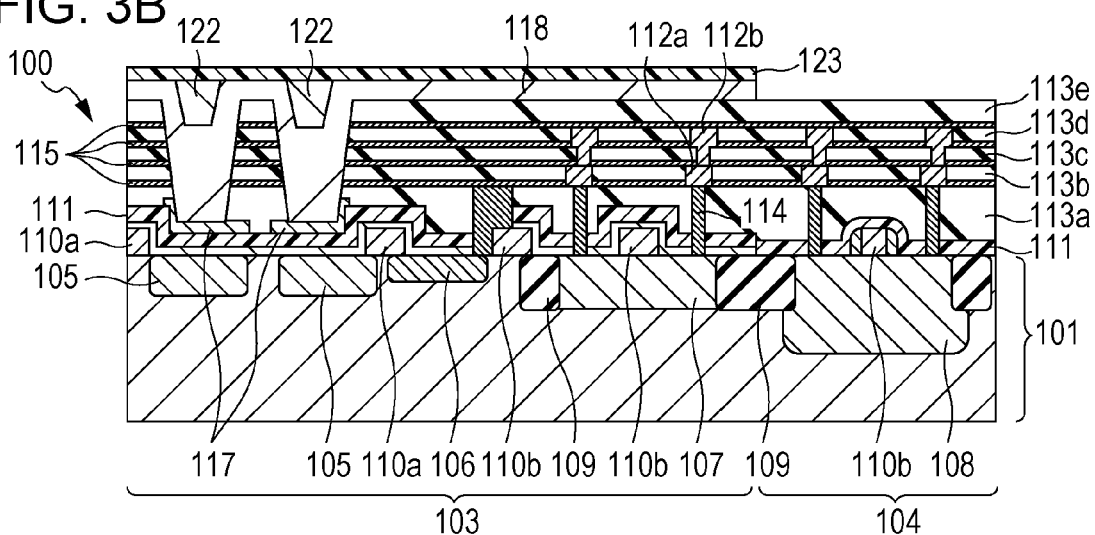
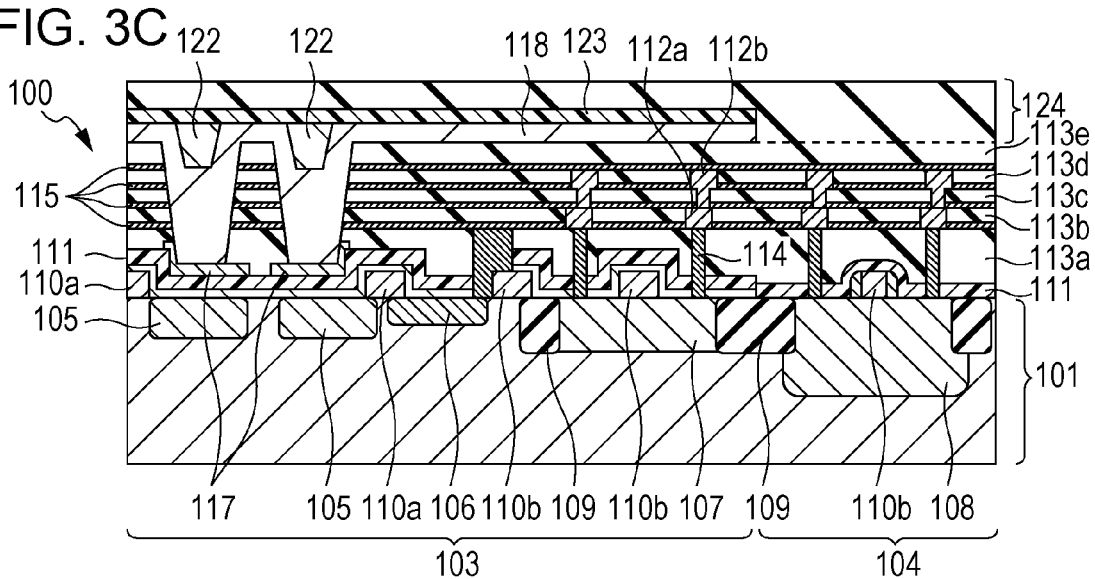

SEMICONDUCTOR DEVICE MANUFACTURING METHOD FOR FORMING AN OPENING TO PROVIDE A PLUG

BACKGROUND OF THE INVENTION

1. Field of the Invention

The present invention relates to a semiconductor device manufacturing method.

2. Description of the Related Art

Regarding solid-state image pickup devices as one type of semiconductor device, a solid-state image pickup device including an optical waveguide has recently been proposed to increase a quantity of light incident on a photoelectric conversion portion.

Japanese Patent Laid-Open No. 2010-103458 discloses a solid-state image pickup device including a waveguide that is made up of a clad layer having a low refractive index, and a core layer having a high refractive index and buried in a groove surrounded by the clad layer. As an exemplary method of manufacturing such a solid-state image pickup device, there is disclosed a method of forming the core layer over an entire surface of the clad layer in which an opening is formed corresponding to the photoelectric conversion portion. Examples of materials usable as the core layer include a silicon nitride film (SiN), a silicon oxynitride film (SiON), and silicon carbide film (SiC).

The related-art method of manufacturing the solid-state image pickup device has a difficulty in forming a plug to electrically interconnect electroconductive members, which constitute a wiring, after forming the waveguide. In more detail, when the silicon nitride film (SiN), the silicon oxynitride film (SiON), or the silicon carbide film (SiC) is formed as the core layer of the waveguide, a step of forming a through-hole to provide the plug may become complicated. Thus, it is difficult to form the through-hole with the related art.

SUMMARY OF THE INVENTION

One embodiment of the present invention provides a semiconductor device manufacturing method. The method includes a first step of, after preparing a semiconductor substrate including a first region and a second region, forming an electrically conductive member on the second region. The method includes a second step of forming a first insulator on the first region and on the second region, wherein the first insulator is formed on a farther side of the conductive member: the farther side from the semiconductor substrate. The method includes a third step of forming a first opening in a first part of the first insulator, wherein the first part is disposed on the first region, while the first insulator is remained at a position where a plug connected to the conductive member is to be disposed. The method includes a fourth step of forming a second insulator inside the first opening and on a second part of the first insulator, wherein the second part is disposed on the second portion. The second insulator is made of a material different from a material of the first insulator. The method includes a fifth step of removing first and second parts of the second insulator such that the first insulator is exposed. Both of the first and second parts of the second insulator are disposed on the second region. The plug is to be disposed in a region where the first part of the second insulator is disposed. The second part of the second insulator is a part thereof within a predetermined distance from the first part of the second insulator. The method includes a sixth step of, after the fifth step, forming a second opening in the first insulator at the position where the plug is to be disposed. The method includes a seventh step of forming the plug in the second opening. An area of the second opening is smaller than an area of the first and second parts of the second insulator, which are removed in the fifth step.

Another embodiment of the present invention provides a semiconductor device manufacturing method. The method includes a first step of, after preparing a semiconductor substrate including a first region where a plurality of photoelectric conversion portions is disposed, and a second region where a circuit for processing signals from the plurality of photoelectric conversion portions is disposed, forming an electrically conductive member on the second region. The method includes a second step of forming a first insulator on the first region and on the second region, wherein the first insulator is formed on a farther side of the conductive member, the farther side from the semiconductor substrate. The method includes a third step of forming a plurality of first openings in a first part of the first insulator such that the plurality of first openings are respectively overlapped with the plurality of photoelectric conversion portions, while the first insulator is remained at a position where a plug connected to the conductive member is to be disposed. The method includes a fourth step of forming a second insulator inside the plurality of first openings and on a second part of the first insulator, wherein the second part is disposed on the second region. The second insulator is made of a material different from a material of the first insulator. The method includes a fifth step of removing first and second parts of the second insulator such that the first insulator is exposed. Both of the first and second parts of the second insulator are disposed on the second region. The plug is to be disposed in a region where the first part of the second insulator is disposed. The second part of the second insulator is within a predetermined distance from the first part of the second insulator. The method includes a sixth step of, after the fifth step, forming a second opening in the first insulator at the position where the plug is to be disposed. The method includes a seventh step of forming the plug in the second opening. An area of the second opening is smaller than an area of the first and second parts of the second insulator, which are removed in the fifth step.

Further features of the present invention will become apparent from the following description of exemplary embodiments with reference to the attached drawings.

BRIEF DESCRIPTION OF THE DRAWINGS

FIG. 3A illustrates the method of manufacturing the solid-state image pickup device according to the first embodiment.

FIG. 3B illustrates the method of manufacturing the solid-state image pickup device according to the first embodiment.

FIG. 3C illustrates the method of manufacturing the solid-state image pickup device according to the first embodiment.

DESCRIPTION OF THE EMBODIMENTS

Figure 1A:
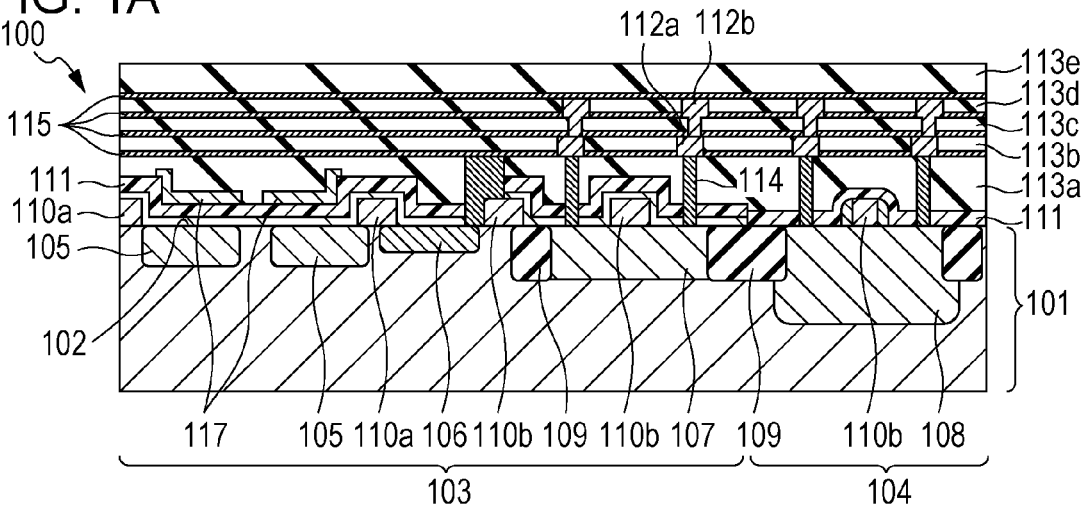
FIG. 1A illustrates a method of manufacturing a solid-state image pickup device according to a first embodiment.

The present invention is concerned with a semiconductor device manufacturing method. Embodiments of the present invention can be applied to, for example, a method of manufacturing a solid-state image pickup device. The solid-state image pickup device is a semiconductor device including a semiconductor substrate on which a plurality of photoelectric conversion portions is disposed.

An embodiment of the present invention will be described below, by way of example, in connection with the method of manufacturing the solid-state image pickup device. A semiconductor substrate 101 includes an image pickup region 103 where a plurality of photoelectric conversion portions 105 is disposed, and a peripheral region 104 where a circuit for processing signals from the photoelectric conversion portions 105 is disposed. Electroconductive members constituting wirings for the signal processing circuit are disposed in the peripheral region 104. An insulator is disposed on the semiconductor substrate 101. The insulator includes, e.g., a plurality of first to fifth interlayer insulating films 113a to 113e. The fifth interlayer insulating film 113e is disposed on electroconductive members that are included in a second wiring layer 112b.

A plurality of openings 116 is formed in the insulator. In the insulator, the plural openings 116 are formed at positions overlying respectively the plural photoelectric conversion portions 105. A large number of photoelectric conversion portions 105 can be disposed in the image pickup region 103. In such a state, the fifth interlayer insulating film 113e is left on the electroconductive members that are included in the second wiring layer 112b.

Next, a first waveguide member 118 is formed on the insulator in which the openings are formed. The first waveguide member 118 is formed so as to fill the insides of the openings 116. Further, the first waveguide member 118 is formed on the insulator that is disposed on the peripheral region 104. At that time, it is not necessarily required that the insides of the openings 116 are entirely filled with the first waveguide member 118. A void may be left in a part of the inside of the opening 116. The material forming the first waveguide member 118 differs from the material forming the fifth interlayer insulating film 113e.

A part of the first waveguide member 118, which part is disposed in the peripheral region 104 as viewed from above (i.e., above the peripheral region 104), is removed. For example, etching or liftoff can be used as a method of removing the first waveguide member 118. It is just used to remove the part of the first waveguide member 118 from a region, as viewed in a plan view, that includes a position where a plug 121 for electrically connecting the electroconductive member in the second wiring layer 112b and an electroconductive member in a third wiring layer 121c is to be disposed, and that locates within a predetermined distance from the relevant position. The part of the first waveguide member 118, disposed in the peripheral region 104, may be mostly removed. In one embodiment, the part of the first waveguide member 118, disposed in the peripheral region 104, is entirely removed. The above-mentioned predetermined distance may be determined on the basis of the diameter of the plug 121. As an alternative, the predetermined distance may be determined on the basis of the superposition accuracy, the minimum design size, etc. in the semiconductor process.

Moreover, the first waveguide member 118 may be entirely removed in the direction of depth thereof. In other words, the first waveguide member 118 may be removed until the underlying fifth interlayer insulating film 113e is exposed.

Thereafter, a through-hole 125 is formed in the fifth interlayer insulating film 113e at the position where the plug 121 for electrically connecting the electroconductive member in the second wiring layer 112b and the electroconductive member in the third wiring layer 121c is to be disposed. Before forming the through-hole 125, another insulator may be formed, on the fifth interlayer insulating film 113e. In that case, the through-hole 125 may be formed in the other insulator as well.

The through-hole 125 has a smaller area than that of the removed part of the first waveguide member 118. In this specification, unless otherwise specified, the term "area" implies an area determined when looking at the relevant area in a plane that is parallel to an interface between the semiconductor substrate 101 and the insulator disposed in contact with the semiconductor substrate 101 (i.e., parallel to a principal surface 102 of the semiconductor substrate 101). For example, when the through-hole 125 is projected onto a certain plane, the area of the through-hole 125 is provided as an area of a projected region of the through-hole 125 on the relevant plane.

With the manufacturing method according to the embodiment, it is possible to more easily form the through-hole 125 in which the plug 121 is to be disposed. The reason is discussed in brief below. The first waveguide member 118 is formed of a material differing from that of the fifth interlayer insulating film 113*e*. This is because an optical waveguide is formed by setting the refractive index of the first waveguide member 118, which is buried in the opening 116 to be higher than that of the interlayer insulating films surrounding the opening 116. When the different materials are stacked, as described above, at the position where the through-hole 125 is to be formed, the through-hole 125 is formed by carrying out processes under plural different conditions. In other words, the through-hole 125 can be more easily formed by, before forming the through-hole 125, removing the part of the first waveguide member 118, which locates at the position where the through-hole 125 is to be formed and within the predetermined distance from the position where the through-hole 125 is to be formed.

The embodiment of the present invention can be applied to the case where a through-hole is formed at a position at which different materials are disposed in superposing (overlying) relation, as described above.

While the following description is made on the case where an electron is a signal charge, the signal charge may be a hole. When the hole is the signal charge, the following description is similarly adaptable just by reversing the conductivity type of each semiconductor region.

First Embodiment

A method of manufacturing a solid-state image pickup device, according to a first embodiment of the present invention, will be described below with reference to the drawings. FIGS. 1A to 4C are schematic views of a cross-sectional structure of the solid-state image pickup device in successive steps of the manufacturing method according to the first embodiment.

A solid-state image pickup device 100 includes a semiconductor substrate 101. The semiconductor substrate 101 is a portion, which is made of a semiconductor material, among components constituting the solid-state image pickup device. The semiconductor substrate involves a substrate that is obtained by forming, in a semiconductor wafer, a semiconductor region with an ordinary semiconductor manufacturing process. The semiconductor material is, e.g., silicon. An interface between the semiconductor material and another material is a principal surface 102 of the semiconductor substrate 101. The other material is, e.g., a thermally oxidized film that is disposed on the semiconductor substrate in contact with the semiconductor substrate.

In this embodiment, an ordinary semiconductor substrate can be used as the semiconductor substrate 101. P-type semiconductor regions and N-type semiconductor regions are disposed in the semiconductor substrate 101. Reference numeral 102 denotes the principal surface of the semiconductor substrate 101. In this embodiment, the principal surface 102 of the semiconductor substrate 101 is provided by an interface between the semiconductor substrate 101 and the thermally oxidized film (not shown) stacked on the semiconductor substrate 101. The semiconductor substrate 101 includes an image pickup region 103 where a plurality of pixels is disposed, and a peripheral region 104 where a signal processing circuit for processing signals from the pixels is disposed. The image pickup region 103 and the peripheral region 104 are described later.

It is to be noted that, in this specification, the term "plane" implies a plane parallel to the principal surface 102. For example, the principal surface 102 in a region where photoelectric conversion portions (described later) are disposed, or the principal surface 102 in a channel of a MOS transistor may be regarded as a reference. In this specification, the term "cross-section" implies a plane crossing the plane.

In steps until obtaining the structure illustrated in FIG. 1A, the semiconductor regions are formed in the semiconductor substrate 101, and gate electrodes and multilayer wirings are formed on the semiconductor substrate 101. Photoelectric conversion portions 105, a floating diffusion (hereinafter abbreviated to "FD") 106, and source/drain regions in a well 107 for a pixel transistor are formed in the image pickup region 103 of the semiconductor substrate 101. The photoelectric conversion portions 105 are each, for example, in the form of a photodiode. The photoelectric conversion portion 105 includes the N-type semiconductor region disposed in the semiconductor substrate 101. Electrons generated by photoelectric conversion are collected in the N-type semiconductor region of the photoelectric conversion portion 105. The FD 106 is made of another N-type semiconductor region. The electrons generated in the photoelectric conversion portion 105 are transferred to the FD 106 and are converted to a voltage. The FD 106 is electrically connected to an input node of an amplification portion. Alternatively, the FD 106 may be electrically connected to a signal output line. In this embodiment, the FD 106 is electrically connected to a gate electrode 110*b* of an amplification transistor via a plug 114. Source and drain regions of the amplification transistor for amplifying a signal, source and drain regions of a reset transistor for resetting an input node of the amplification transistor, etc. are formed in the well 107 for the pixel transistor. A well 108 for a peripheral transistor is formed in the peripheral region 104 of the semiconductor substrate 101. Source and drain regions of the peripheral transistor, which constitutes the signal processing circuit, are formed in the well 108 for the peripheral transistor. In addition, an element isolation portion 109 may be formed in the semiconductor substrate 101. The element isolation portion 109 electrically isolates the pixel transistor or the peripheral transistor from the other elements. The element isolation portion 109 is formed by, e.g., STI (Shallow Trench Isolation) or LOCOS (LOCal Oxidation of Silicon).

Further, in the steps until obtaining the structure illustrated in FIG. 1A, transfer gate electrodes 110*a* and gate electrodes 110*b* are formed. The transfer gate electrodes 110*a* and the gate electrodes 110*b* are disposed on the semiconductor substrate 101 with oxide films (not shown) interposed therebetween. Each of the transfer gate electrodes 110*a* controls transfer of charges between the photoelectric conversion portion 105 and the FD 106. The gate electrodes 110*b* serve as respective gates of the pixel transistor and the peripheral transistor.

Moreover, in the steps until obtaining the structure illustrated in FIG. 1A, a protective layer 111 is formed on the semiconductor substrate 101. The protective layer 111 is, e.g., a silicon nitride film. The protective layer 111 may be made up of plural layers including a silicon nitride film and a silicon oxide film. Also, the protective layer 111 may have the function of reducing damage that is possibly exerted on the photoelectric conversion portions in subsequent steps. Alternatively, the protective layer 111 may have the anti-reflective function. Alternatively, the protective layer 111 may have the function of preventing diffusion of a metal in a silicide forming step. Further, an etch stop member 117 is formed on a surface of the protective layer 111 on the side opposite to the semiconductor substrate 101. The etch stop member 117 may have a larger area than that of the bottom of the opening 116 that is formed in a later step. It is to be noted that the protective layer 111 and the etch stop member 117 are not necessarily required.

Then, the first wiring layer 112a, the second wiring layer 112b, and the plural interlayer insulating films 113a to 113e are formed. In this embodiment, the first wiring layer 112a and the second wiring layer 112b are formed by the damascene process. For convenience of explanation, the plural interlayer insulating films are called the first to fifth interlayer insulating films 113a to 113e successively from the side closest to the semiconductor substrate 101.

The first interlayer insulating film 113a is formed in the image pickup region 103 and the peripheral region 104. A surface of the first interlayer insulating film 113a on the side opposite to the semiconductor substrate 101 may be flattened. Through-holes are formed in the first interlayer insulating film 113a. Plugs 114 for electrically connecting the electroconductive members in the first wiring layer 112a and the semiconductor regions of the semiconductor substrate 101 are disposed in the through-holes. The plugs 114 are each made of an electroconductive material. The plug 114 is made of, e.g., tungsten.

Next, the second interlayer insulating film 113b is formed on a surface of the first interlayer insulating film 113a on the side opposite to the semiconductor substrate 101. Parts of the second interlayer insulating film 113b, which parts correspond to regions where the electroconductive members in the first wiring layer 112a are to be disposed, are removed by etching. Thereafter, a metal film serving as a material of the first wiring layer 112a is formed in the image pickup region 103 and the peripheral region 104. Thereafter, the metal film is removed by CMP (Chemical Mechanical Polishing), for example, until the second interlayer insulating film 113b is exposed. With the above-described procedures, the electroconductive members constituting the wiring in the first wiring layer 112a are disposed in a predetermined pattern.

Then, the third interlayer insulating film 113c and the fourth interlayer insulating film 113d are successively formed in the image pickup region 103 and the peripheral region 104. Parts of the fourth interlayer insulating film 113d, which parts correspond to the regions where the electroconductive members in the second wiring layer 112b are to be disposed, are removed by etching. Next, parts of the third interlayer insulating film 113c, which parts correspond to the regions where plugs for electrically connecting the electroconductive members in the first wiring layer 112a and the electroconductive members in the second wiring layer 112b are to be disposed, are removed by etching. Thereafter, a metal film serving as a material of both the second wiring layer 112b and the plugs is formed in the image pickup region 103 and the peripheral region 104. Thereafter, the metal film is removed by CMP, for example, until the fourth interlayer insulating film 113d is exposed. With the above-described procedures, a wiring pattern for the second wiring layer 112b and a pattern for the plugs are obtained. Alternatively, after forming the third interlayer insulating film 113c and the fourth interlayer insulating film 113d, the parts corresponding to the regions where the plugs for electrically connecting the electroconductive members in the first wiring layer 112a and the electroconductive members in the second wiring layer 112b are to be disposed may be removed earlier by etching.

Finally, the fifth interlayer insulating film 113e is formed in the image pickup region 103 and the peripheral region 104. A surface of the fifth interlayer insulating film 113e on the side opposite to the semiconductor substrate 101 may be flattened by CMP, for example.

The first wiring layer 112a and the second wiring layer 112b may be formed by some other method than the damascene process. One example of the method other than the damascene process is described below. After forming the first interlayer insulating film 113a, the metal film serving as the material of the first wiring layer 112a is formed in the image pickup region 103 and the peripheral region 104. Next, parts of the metal film other than the regions where the electroconductive members in the first wiring layer 112a are to be disposed are removed by etching. As a result, a wiring pattern for the first wiring layer 112a is obtained. Then, after forming the second interlayer insulating film 113b and the third interlayer insulating film 113c, the second wiring layer 112b is formed in a similar manner. After forming the second wiring layer 112b, the fourth interlayer insulating film 113d and the fifth interlayer insulating film 113e are formed. Respective surfaces of the third interlayer insulating film 113c and the fifth interlayer insulating film 113e on the side opposite to the semiconductor substrate 101 may be flattened.

The first wiring layer 112a and the second wiring layer 112b are disposed at different heights from the principal surface of the semiconductor substrate 101 as a reference. In this embodiment, the electroconductive members in both the first wiring layer 112a and the second wiring layer 112b are made of copper. The electroconductive members may be made of other material than copper insofar as the material is electrically conductive. Except for the parts electrically interconnected by the plugs, the electroconductive members in the first wiring layer 112a and the electroconductive members in the second wiring layer 112b are insulated from each other by the third interlayer insulating film 113c. It is to be noted that the number of wiring layers is not limited to two, and the wiring layer may be formed as a single layer or three or more layers.

An etch stop film, a metal diffusion preventive film, or a film having both the etch stop function and the metal diffusion preventive function may be disposed between adjacent two of the interlayer insulating films. In this embodiment, the plural interlayer insulating films 113a to 113e are each a silicon oxide film. A silicon nitride film serves as an etch stop film for the silicon oxide film. Therefore, an etch stop film 115 is disposed between adjacent two of the interlayer insulating films. The etch stop film 115 is not necessarily required to be disposed.

Figure 1B:
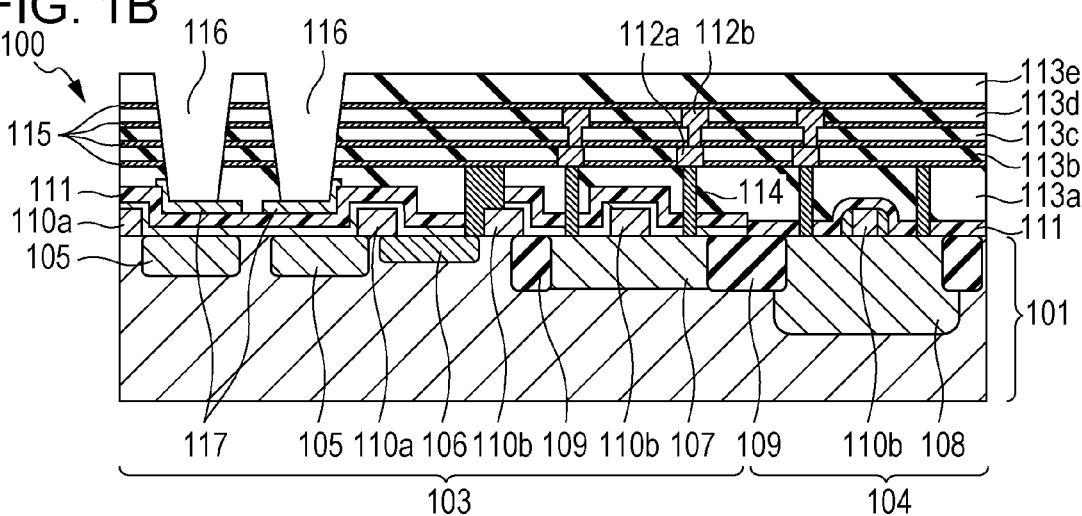
FIG. 1B illustrates the method of manufacturing the solid-state image pickup device according to the first embodiment.

In a step illustrated in FIG. 1B, the openings 116 are each formed through respective regions of the plural interlayer insulating films 113a to 113e, which regions are positioned overlying the photoelectric conversion portions 105. In the case where the diffusion preventive film 115 is disposed, openings are also formed in regions of the diffusion preventive film 115 corresponding to the photoelectric conversion portions 105.

First, a mask pattern (not shown) for etching is stacked on a surface of the fifth interlayer insulating film 113e on the side opposite to the semiconductor substrate 101. The mask pattern for etching is formed except for a region where the opening 116 is to be disposed. In other words, the mask pattern for etching has an opening in the region where the opening 116 is to be disposed. The mask pattern for etching is, for example, a photoresist that is patterned by photolithography and development.

Then, the plural interlayer insulating films 113a to 113e and the diffusion preventive films 115 are etched while the mask pattern for etching is used as a mask. As a result, the opening 116 is formed. Alternatively, the opening 116 may be formed by repeating the etching several times under different conditions. The mask pattern for etching may be removed after the etching.

When the etch stop member 117 is disposed, the etching is performed in the step illustrated in FIG. 1B until the etch stop member 117 is exposed. In one embodiment, under conditions for etching the first interlayer insulating film 113a, an etching rate of the etch stop member 117 is set to be smaller than that of the first interlayer insulating film 113a. When the first interlayer insulating film 113a is a silicon oxide film, the etch stop member 117 can be a silicon nitride film or a silicon oxynitride film. Further, the etch stop member 117 may be exposed by repeating the etching several times under different conditions.

Regarding a cross-sectional shape of the opening 116, the opening 116 is not necessarily required to penetrate through all the first to fifth interlayer insulating films 113a to 113e. The opening 116 may be a recess formed in the first to fifth interlayer insulating films 113a to 113e. The opening 116 has such a plan shape that the boundary of the opening 116 has a closed loop, e.g., a circle or a rectangle. Alternatively, the plan shape of the opening 116 may be a groove-like shape extending over two or more photoelectric conversion portions 105. Thus, in this specification, when, in a certain plane, a region where the fifth interlayer insulating film 113e is not disposed is surrounded by or sandwiched between regions where the fifth interlayer insulating film 113e is disposed, it is said that the fifth interlayer insulating film 113e has the opening 116.

When looking at the opening 116 in a plan view, at least a part of the opening 116 is positioned in overlapped relation to the photoelectric conversion portion 105. In other words, when the opening 116 and the photoelectric conversion portion 105 are projected to the same plane, projected regions of both the opening 116 and the photoelectric conversion portion 105 overlap with each other in the same plane.

In this embodiment, the opening 116 is formed in the region overlapping with the photoelectric conversion portion 105, and the opening 116 is not formed in the peripheral region 104. However, the opening 116 may be formed in the peripheral region 104. In that case, a density of the openings 116 formed in the image pickup region 103 may be set to be higher than that of the openings 116 formed in the peripheral region 104. The density of the openings 116 can be determined as the number of openings 116 disposed per unit area. Alternatively, the density of the openings 116 may be determined as a proportion of areas occupied by the openings 116.

Figure 1C:
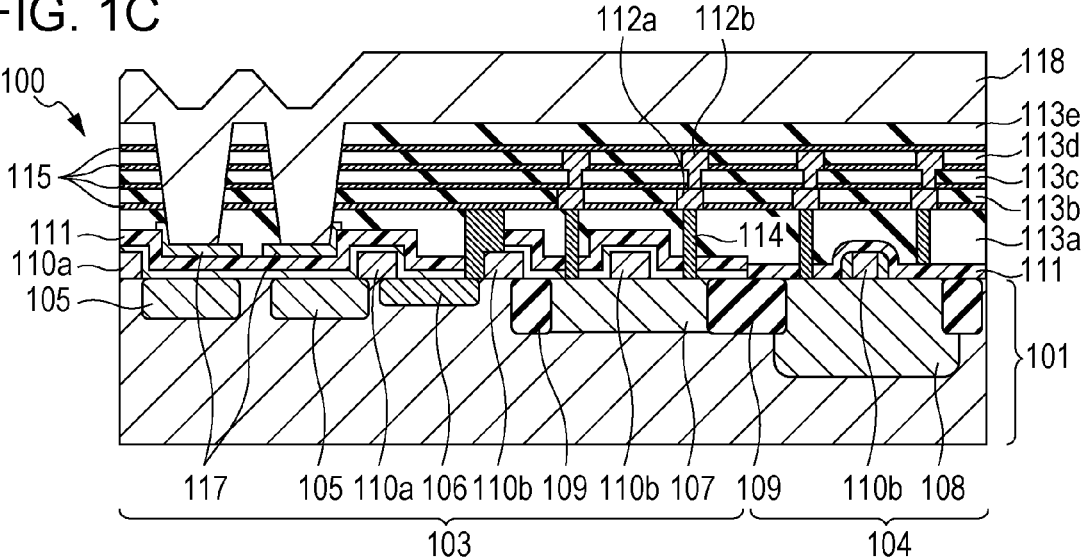
FIG. 1C illustrates the method of manufacturing the solid-state image pickup device according to the first embodiment.

In a step illustrated in FIG. 1C, the first waveguide member 118 is formed inside the openings 116 and on the fifth interlayer insulating film 113e. More specifically, the first waveguide member 118 is formed in the image pickup region 103 and the peripheral region 104. The first waveguide member 118 can be formed, for example, by a film forming process, such as CVD (Chemical Vapor Deposition) or sputtering, or by coating an organic material such as represented by a polyimide-based high polymer. The first waveguide member 118 may be formed through plural steps under different conditions. In that case, for example, the first waveguide member 118 may be formed in a first step under the condition suitable for increasing adhesion with respect to the underlying layer, and the first waveguide member 118 may be formed in a subsequent step under the condition suitable for improving a characteristic for filling the inside of the opening 116. Alternatively, the first waveguide member 118 may be formed by forming different types of materials in order. For example, the first waveguide member 118 may be formed by first depositing a silicon nitride film, and then depositing an organic material with a higher filling characteristic. When the first interlayer insulating film 113a has been etched in the step of FIG. 1B until the etch stop member 117 is exposed, the first waveguide member 118 is disposed in contact with the etch stop member 117.

The material of the first waveguide member 118 has a higher refractive index than that of the material of the interlayer insulating films 113a to 113e. When the interlayer insulating films 113a to 113e are silicon oxide films, the material of the first waveguide member 118 can be, e.g., a silicon nitride film or a polyimide-based organic material. The refractive index of the silicon nitride film is about 2.0. The refractive index of the surrounding silicon oxide film is about 1.4. Therefore, light is reflected at the interface between the first waveguide member 118 and each of the interlayer insulating films 113a to 113e on the basis of the Snell's law. As a result, the light can be enclosed inside the first waveguide member 118. Further, the hydrogen content of the silicon nitride film can be increased such that dangling bonds in the substrate are terminated by the hydrogen supply effect. This is effective in reducing noise, such as white defects. The refractive index of the polyimide-based organic material is about 1.7. The filling characteristic of the polyimide-based organic material is superior to that of the silicon nitride film. The material of the first waveguide member 118 may be suitably selected in consideration of balance between optical characteristics, such as difference in refractive index, and the beneficial effect from the viewpoint of the manufacturing process.

The positional relationships between the plural interlayer insulating films 113a to 113e and the first waveguide member 118 filled in the opening 116 will be described below. In a certain plane, the region where the first waveguide member 118 is disposed is surrounded by or sandwiched between the regions where the plural interlayer insulating films 113a to 113e are disposed. In other words, respective first parts of the plural interlayer insulating films 113a to 113e, respective second parts thereof differing from the first parts, and the first waveguide member 118 filled in the opening 116 are positioned in a line in a direction crossing the direction in which the photoelectric conversion portion 105 and the first waveguide member 118 filled in the opening 116 are positioned in a line. The direction crossing the direction in which the photoelectric conversion portion 105 and the first waveguide member 118 filled in the opening 116 are positioned in a line is, for example, a direction parallel to the principal surface 102 of the semiconductor substrate 101.

The first waveguide member 118 is disposed at a position overlying the photoelectric conversion portion 105 on the semiconductor substrate 101. The plural interlayer insulating films 113a to 113e are disposed around the first waveguide member 118. The refractive index of the material forming the first waveguide member 118 may be higher than that of the material forming the plural interlayer insulating films 113a to 113e. With that relationship in refractive index, of the light incident on the first waveguide member 118, a quantity of light leaking to the plural interlayer insulating films 113a to 113e can be reduced. Therefore, when at least a part of the first waveguide member 118 is disposed in overlapped relation to the photoelectric conversion portion 105, a quantity of light incident on the photoelectric conversion portion 105 can be increased.

The refractive index of the first waveguide member 118 is not always needed to be higher than that of the plural interlayer insulating films 113a to 113e. The first waveguide member 118 can function as an optical waveguide insofar as the light incident on the first waveguide member 118 does not leak to the surrounding insulator. For example, a reflecting member for reflecting the incident light may be formed on an inner sidewall of the opening 116, and the first waveguide member 118 may be filled in the remaining inside of the opening 116. Alternatively, an air gap may exist between the first waveguide member 118 filled in the opening 116 and the plural interlayer insulating films 113a to 113e. The air gap may be held in a vacuum state or may be filled with a gas. In such a case, the refractive index of the material forming the first waveguide member 118 and the refractive index of the material forming the plural interlayer insulating films 113a to 113e may be set in any magnitude relationship therebetween.

In this embodiment, a silicon oxide film is disposed as the fifth interlayer insulating film 113e on the electroconductive members in the second wiring layer 112b. Further, a silicon nitride film is disposed as the first waveguide member 118 on the fifth interlayer insulating film 113e. However, the insulator disposed on the electroconductive members in the second wiring layer 112b is not limited to the silicon oxide film. As another example, SiC may be formed on the electroconductive members in the second wiring layer 112b, and a silicon nitride film may be formed as the first waveguide member 118 on the SiC. The resistivity of SiC is much lower than that of the electroconductive member, and SiC can sufficiently function as an insulator.

Figure 2A:
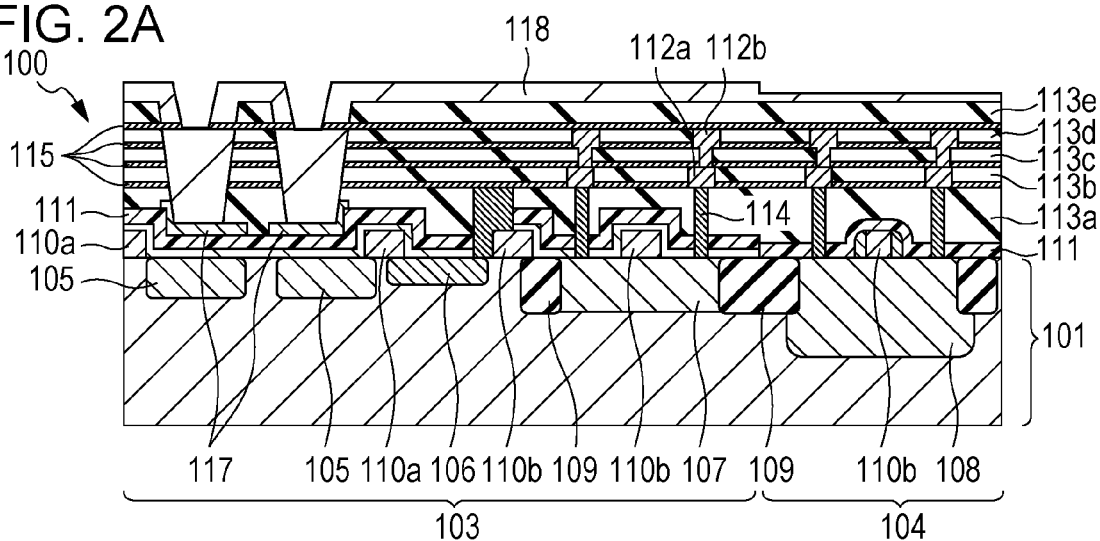
FIG. 2A illustrates the method of manufacturing the solid-state image pickup device according to the first embodiment.

Next, in a step illustrated in FIG. 2A, a part of the first waveguide member 118, which part is disposed in the peripheral region 104, is removed. First, an etching mask (not shown) is stacked on the first waveguide member 118. The etching mask has an opening at a position corresponding to the peripheral region 104. The part of the first waveguide member 118, disposed in the peripheral region 104, is then removed by etching.

At that time, the part of the first waveguide member 118, which part is disposed in the peripheral region 104, is etched away such that the first waveguide member 118 is left in a predetermined film thickness. With the presence of the first waveguide member 118 in the predetermined film thickness, damage possibly exerted on the semiconductor substrate side by the etching can be reduced. As an alternative, the first waveguide member 118 may be removed until the fifth interlayer insulating film 113e is exposed.

In this embodiment, the part of the first waveguide member 118, which part is disposed over the entire peripheral region 104, is etched. Stated another way, the etching mask is not disposed in the peripheral region 104. Thus, a relatively large area may be etched. However, the part of the first waveguide member 118, disposed in the peripheral region 104, may be partially removed. Herein, the term "area" implies an area measured in the plane.

The method of removing the part of the first waveguide member 118, which part is disposed in the peripheral region 104, is not limited to the etching. For example, liftoff may be used to remove that part of the first waveguide member 118. In the case of liftoff, more specifically, an underlying film is formed in the peripheral region 104 before forming the first waveguide member 118. By removing the underlying film after forming the first waveguide member 118, the first waveguide member 118 disposed on the underlying film is also removed at the same time.

In the step illustrated in FIG. 2A, a part of the first waveguide member 118, which part is disposed in the image pickup region 103, may also be removed.

Figure 2B:
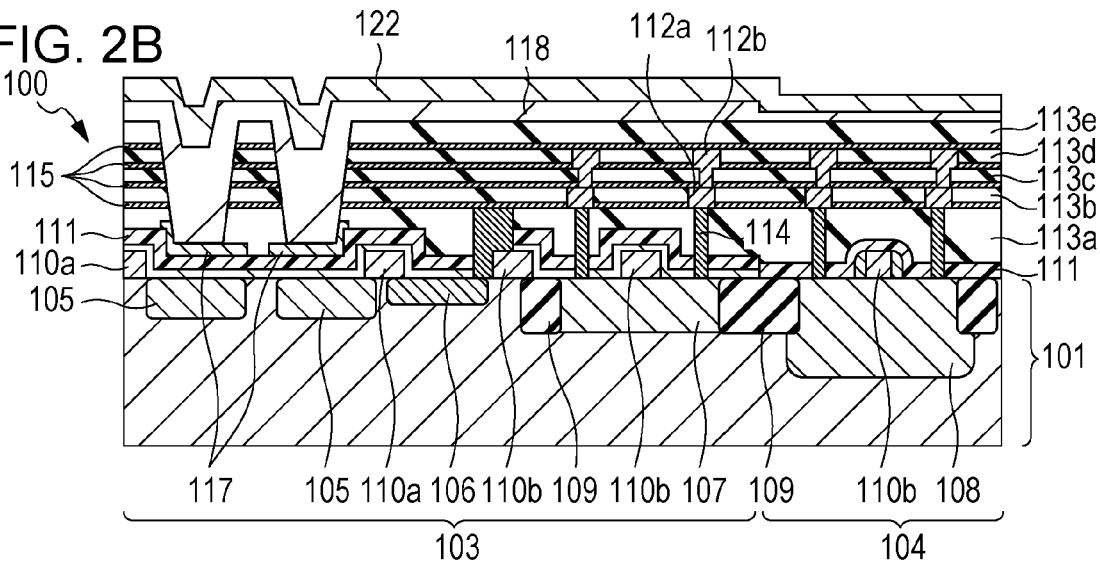
FIG. 2B illustrates the method of manufacturing the solid-state image pickup device according to the first embodiment.

In a step illustrated in FIG. 2B, a second waveguide member 122 is formed on a surface of the first waveguide member 118 on the side opposite to the semiconductor substrate 101. The second waveguide member 122 is formed in the image pickup region 103 and the peripheral region 104. In this embodiment, the step of forming the first waveguide member 118 and the step of forming the second waveguide member 122 differ from each other in that the step of removing the part of the first waveguide member 118, which part is disposed in the peripheral region 104, has been performed before the step of forming the second waveguide member 122. Thus, the second waveguide member 122 may be formed by using the same material as that of the first waveguide member 118. Further, the second waveguide member 122 may be formed in the same manner as that in forming the first waveguide member 118. Alternatively, the second waveguide member 122 may be formed by using a different material from that of the first waveguide member 118, and the second waveguide member 122 may be formed in a different manner from that in forming the first waveguide member 118.

In this embodiment, the first waveguide member 118 and the second waveguide member 122 are made of the same material. More specifically, the second waveguide member 122 is made of silicon nitride. In that case, the second waveguide member 122 can be formed by CVD or sputtering. As an alternative, the second waveguide member 122 may be formed by coating an organic material represented by a polyimide-based high polymer.

In this embodiment, the first waveguide member 118 and the second waveguide member 122 are both formed by CVD. However, process conditions for the CVD differ between both the cases. The second waveguide member 122 may be formed by carrying out plural steps under different conditions. Further, the second waveguide member 122 may be formed by coating plural different kinds of materials in order.

Figure 2C:
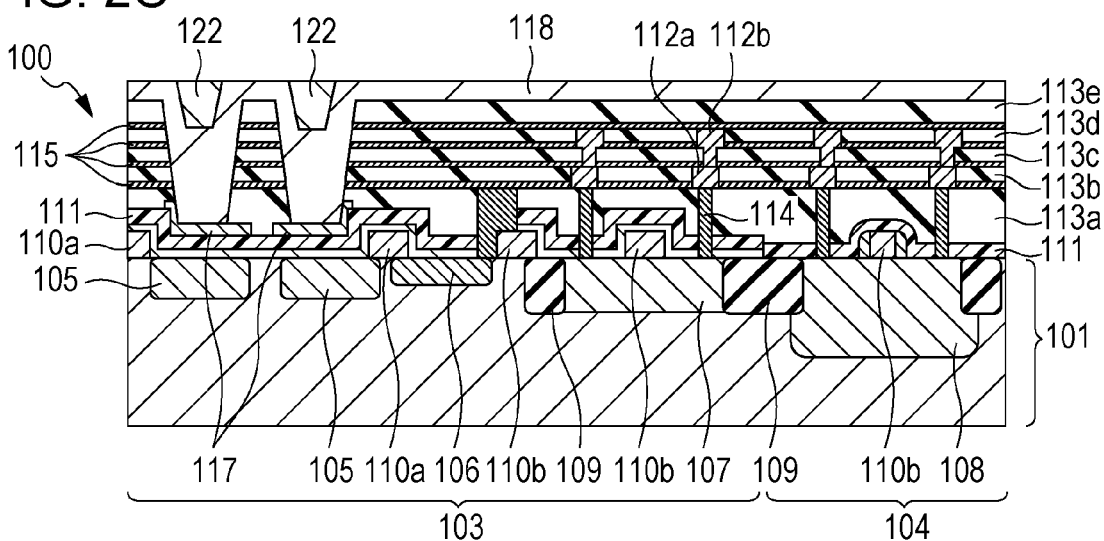
FIG. 2C illustrates the method of manufacturing the solid-state image pickup device according to the first embodiment.

FIG. 2C illustrates a flattening step after forming the second waveguide member 122. In this embodiment, a surface of the second waveguide member 122 on the side opposite to the semiconductor substrate 101 is flattened by CMP. The flattening can be performed by one of ordinary methods. For example, the flattening may be performed by polishing or etching. The first waveguide member 118 or some other member positioned on the side closer to the semiconductor substrate 101 than the second waveguide member 122 may be exposed by the flattening. In this embodiment, the first waveguide member 118 is exposed in the peripheral region 104. The second waveguide member 122 is left in the image pickup region 103. However, the second waveguide member 122 may be left in the peripheral region 104 as well.

In the step illustrated in FIG. 2C, the surface of the second waveguide member 122 on the side opposite to the semiconductor substrate 101 is not necessarily required to be completely flattened. A level difference in the surface of the second waveguide member 122 on the side opposite to the semiconductor substrate 101 before the flattening is to be reduced by the flattening step. For example, in the peripheral region 104, a total film thickness of the first waveguide member 118 and the second waveguide member 122 after the flattening is in the range of 200 nm to 500 nm. Also, in a zone of the image pickup region 103 where the openings 116 are not disposed, a total film thickness of the first waveguide member 118 and the second waveguide member 122 after the flattening is in the range of 50 nm to 350 nm.

In this embodiment, the surface of the second waveguide member 122 on the side opposite to the semiconductor substrate 101 is exposed when the flattening step is performed. When another member is formed on the second waveguide member 122, an exposed surface of the other member is flattened.

In a step illustrated in FIG. 3A, a low refractive-index member 123 is formed. The refractive index of the low refractive-index member 123 is lower than that of the member which is disposed on the side closer to the semiconductor substrate 101 than the low refractive-index member 123 and which is positioned in contact with the low refractive-index member 123. In other words, the member disposed on the side closer to the semiconductor substrate 101 than the low refractive-index member 123 and positioned in contact with the low refractive-index member 123 is a member that is exposed at the time of forming the low refractive-index member 123. In this embodiment, both the first waveguide member 118 and the second waveguide member 122 correspond to the above-mentioned member. Thus, in this embodiment, the refractive index of the low refractive-index member 123 is lower than those of the first waveguide member 118 and the second waveguide member 122. In practice, the low refractive-index member 123 is formed of a silicon oxynitride film. The silicon oxynitride film has a refractive index of about 1.72. It is to be noted that the low refractive-index member 123 is not necessarily required. When the low refractive-index member 123 is not disposed, the step illustrated in FIG. 3A can be omitted.

In a step illustrated in FIG. 3B, a part of the first waveguide member 118, which part is formed in the peripheral region 104, a part of the second waveguide member 122, which part is formed in the peripheral region 104, or both the parts are removed. Particularly, in this step the first waveguide member 118 and the second waveguide member 122 in respective parts, which are disposed at the position where a plug 121 (described later) is to be disposed, and which are disposed within a predetermined distance from the position where the plug 121 is to be disposed, may be removed. Further, when the low refractive-index member 123 is disposed, a part of the low refractive-index member 123, which part is disposed in the peripheral region 104, is also removed.

Depending on the steps prior to this step, one of the first waveguide member 118 and the second waveguide member 122 may be not disposed in the peripheral region 104. In such a case, the other of the first waveguide member 118 and the second waveguide member 122, which is disposed in the peripheral region 104, is removed.

The removing step can be performed by using one of ordinary methods. In this embodiment, the respective parts of the first waveguide member 118, the second waveguide member 122 and the low refractive-index member 123, which parts are formed in the peripheral region 104, are removed by etching, for example.

In this step, a part of the first waveguide member 118, which part is formed in the image pickup region 103, may be removed.

In a step illustrated in FIG. 3C, a seventh interlayer insulating film 124 is formed. The seventh interlayer insulating film 124 is formed of the same material as that of the fifth interlayer insulating film 113e. A surface of the seventh interlayer insulating film 124 on the side opposite to the semiconductor substrate 101 may be flattened when necessary.

Figure 4A:
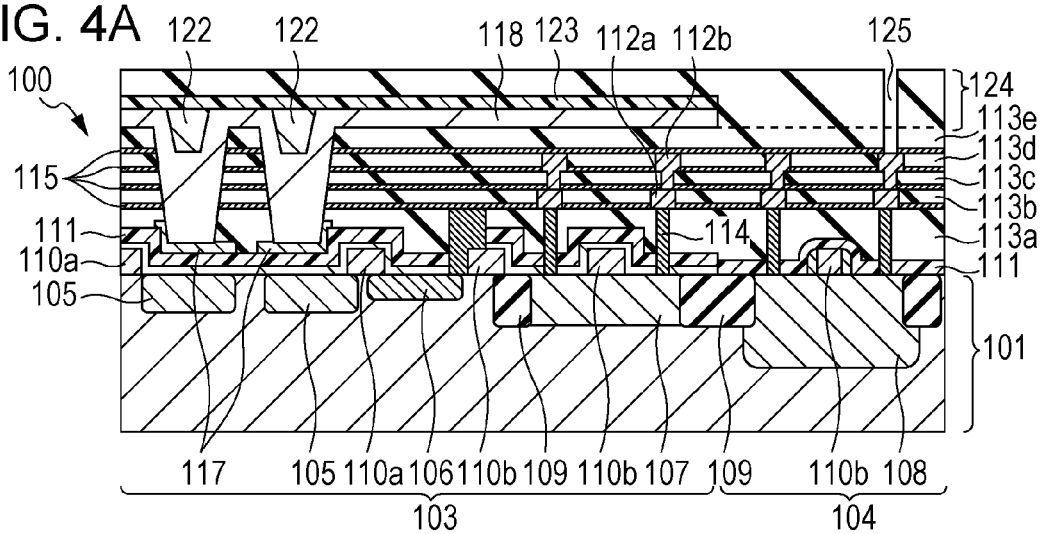
FIG. 4A illustrates the method of manufacturing the solid-state image pickup device according to the first embodiment.

In a step illustrated in FIG. 4A, a through-hole 125 is formed in the seventh interlayer insulating film 124 at a position overlying the predetermined electroconductive member in the second wiring layer 112b. The through-hole 125 is formed, for example, by etching the seventh interlayer insulating film 124 and the fifth interlayer insulating film 113e.

Figure 4B:
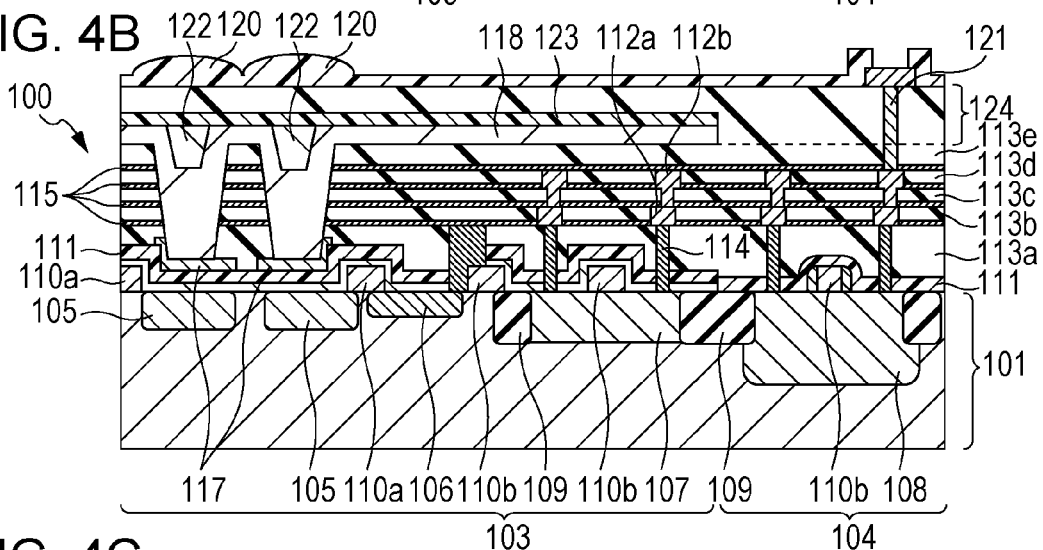
FIG. 4B illustrates the method of manufacturing the solid-state image pickup device according to the first embodiment.

In steps until obtaining the structure illustrated in FIG. 4B, a third wiring layer 121c and in-layer lenses 120 are formed. First, the plug 121 is formed in the through-hole 125. The plug 121 electrically connects the predetermined electroconductive member in the second wiring layer 112b and a predetermined electroconductive member in the third wiring layer 121c. The plug 121 is made of, e.g., tungsten. The material of the plug 121 can be optionally selected insofar as the material is electrically conductive.

Next, the third wiring layer 121c is formed. In this embodiment, the electroconductive member in the third wiring layer 121c is made of aluminum. The third wiring layer 121c can be formed by using, as appropriate, the manner that has been described above in the step of forming the first wiring layer 112a or the second wiring layer 112b. The electroconductive member in the third wiring layer 121c may be made of a metal other than aluminum.

Further, in the steps until obtaining the structure illustrated in FIG. 4B, the in-layer lenses 120 are formed. The in-layer lenses 120 are disposed respectively corresponding to the photoelectric conversion portions 105. The in-layer lenses 120 are each formed of, e.g., a silicon nitride film. The in-layer lenses 120 can be formed by using one of ordinary methods. In this embodiment, the material forming the in-layer lenses 120 is disposed in the peripheral region 104 as well. However, the material forming the in-layer lenses 120 may be disposed only in the image pickup region 103.

Between the in-layer lenses 120 and the seventh interlayer insulating film 124, an intermediate member having an intermediate refractive index between the refractive indices of the former twos may be disposed. In this embodiment, a silicon oxynitride film (not shown) is disposed between the in-layer lenses 120 and the seventh interlayer insulating film 124. More specifically, the refractive index of the silicon nitride film (i.e., the in-layer lens 120) is about 2.00, the refractive index of the silicon oxynitride film (i.e., the intermediate member) is about 1.72, and the refractive index of the silicon oxide film (i.e., the seventh interlayer insulating film 124) is about 1.45.

The above-described arrangement is effective in reducing reflectivity. That point is discussed in brief below. Generally, when light propagates from a medium having a refractive index of n1 to a medium having a refractive index of n2, the reflectivity increases as the difference between n1 and n2 increases. When the intermediate member having the intermediate refractive index is disposed between the in-layer lenses 120 and the seventh interlayer insulating film 124, the difference in refractive index at an interface between adjacent twos is reduced. As a result, the reflectivity when light enters the seventh interlayer insulating film 124 from the in-layer lens 120 can be reduced in comparison with that when the in-layer lens 120 and the seventh interlayer insulating film 124 are disposed in direct contact with each other. Similarly, with the provision of, between the seventh interlayer insulating film 124 and the second waveguide member 122, the low refractive-index member 123 having an intermediate refractive index between the refractive indices of the former two, the difference in refractive index at an interface between adjacent twos is reduced. As a result, the reflectivity when light enters the second waveguide member 122 from the seventh interlayer insulating film 124 can be reduced.

The extent of reduction in the reflectivity resulting from the provision of the intermediate member varies depending on the relationship among a film thickness d of the intermediate member, a refractive index N of the intermediate member, and a wavelength p of the incident light. The reason is that multiple-reflected lights from plural interfaces cancel each other. Theoretically, given that k is an arbitrary integer equal to or more than 0, the reflectivity is minimized when the condition expressed by the following formula (1) is satisfied:

$$d = \frac{p}{4N}(2k+1) \quad (1)$$

Stated another way, the reflectivity is theoretically minimized when the film thickness of the intermediate member is an odd multiple of p/4N. Accordingly, the film thickness of the intermediate member can be set on the basis of the above formula (1). In particular, the film thickness of the intermediate member satisfies the following formula (2). In one embodiment, k=0 is satisfied in the formula (2).

$$\frac{p}{4N}(2k+0.5) < d < \frac{p}{4N}(2k+1.5) \quad (2)$$

Let here suppose, e.g., an example in which the refractive index of the seventh interlayer insulating film 124 is 1.45, the refractive index of the intermediate member is 1.72, the refractive index of the in-layer lens 120 is 2.00, and the wavelength of the incident light is 550 nm. On that condition, when the film thickness of the intermediate member is 80 nm, the transmittance of light transmitting from the in-layer lens 120 to the seventh interlayer insulating film 124 is about 1.00. On the other hand, when the in-layer lens 120 and the seventh interlayer insulating film 124 are disposed in direct contact with each other, the transmittance is about 0.97.

Figure 4C:
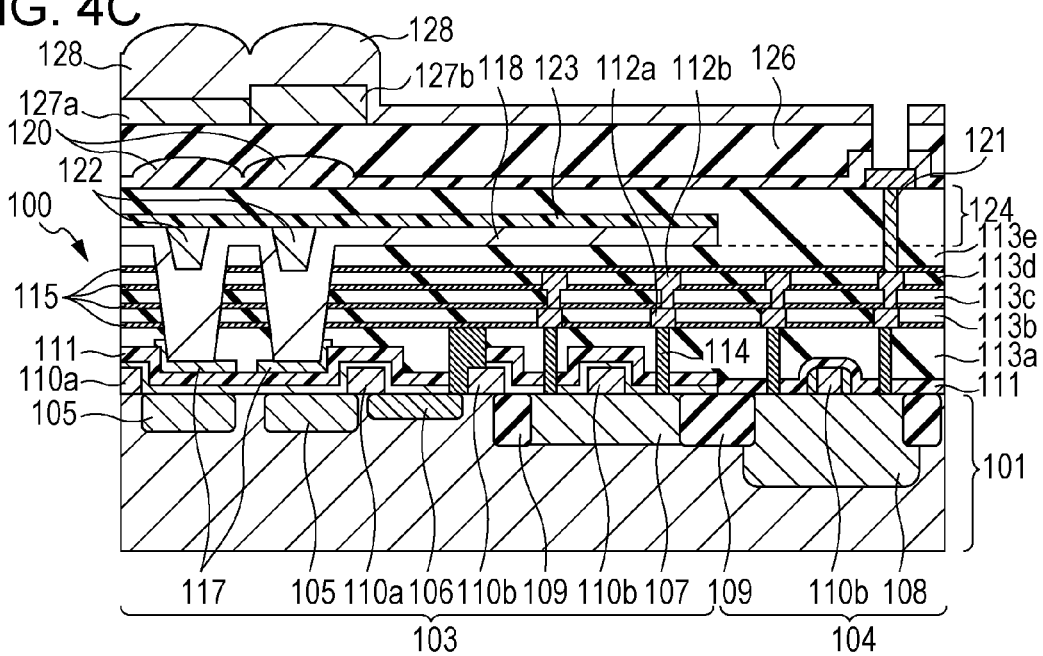
FIG. 4C illustrates the method of manufacturing the solid-state image pickup device according to the first embodiment.

In steps until obtaining the structure illustrated in FIG. 4C, color filters 127a and 127b and microlenses 128 are formed. First, an eighth insulating film 126 is formed on surfaces of the in-layer lenses 120 on the side opposite to the semiconductor substrate 101. The eighth insulating film 126 is made of, e.g., an organic material. A surface of the eighth insulating film 126 on the side opposite to the semiconductor substrate 101 is flattened. The eighth insulating film 126 having the flattened surface on the side opposite to the semiconductor substrate 101 can be formed, for example, by coating the organic material that is used to form the eighth insulating film 126.

Next, the color filters 127a and 127b are formed. The color filters 127a and 127b are disposed corresponding to the photoelectric conversion portions 105. The wavelength of light passing through the color filter 127a may differ from that of light passing through the color filter 127b. Then, the microlenses 128 are formed on surfaces of the color filters 127a and 127b on the side opposite to the semiconductor substrate 101. The microlenses 128 can be formed by using one of ordinary methods.

Figure 5:
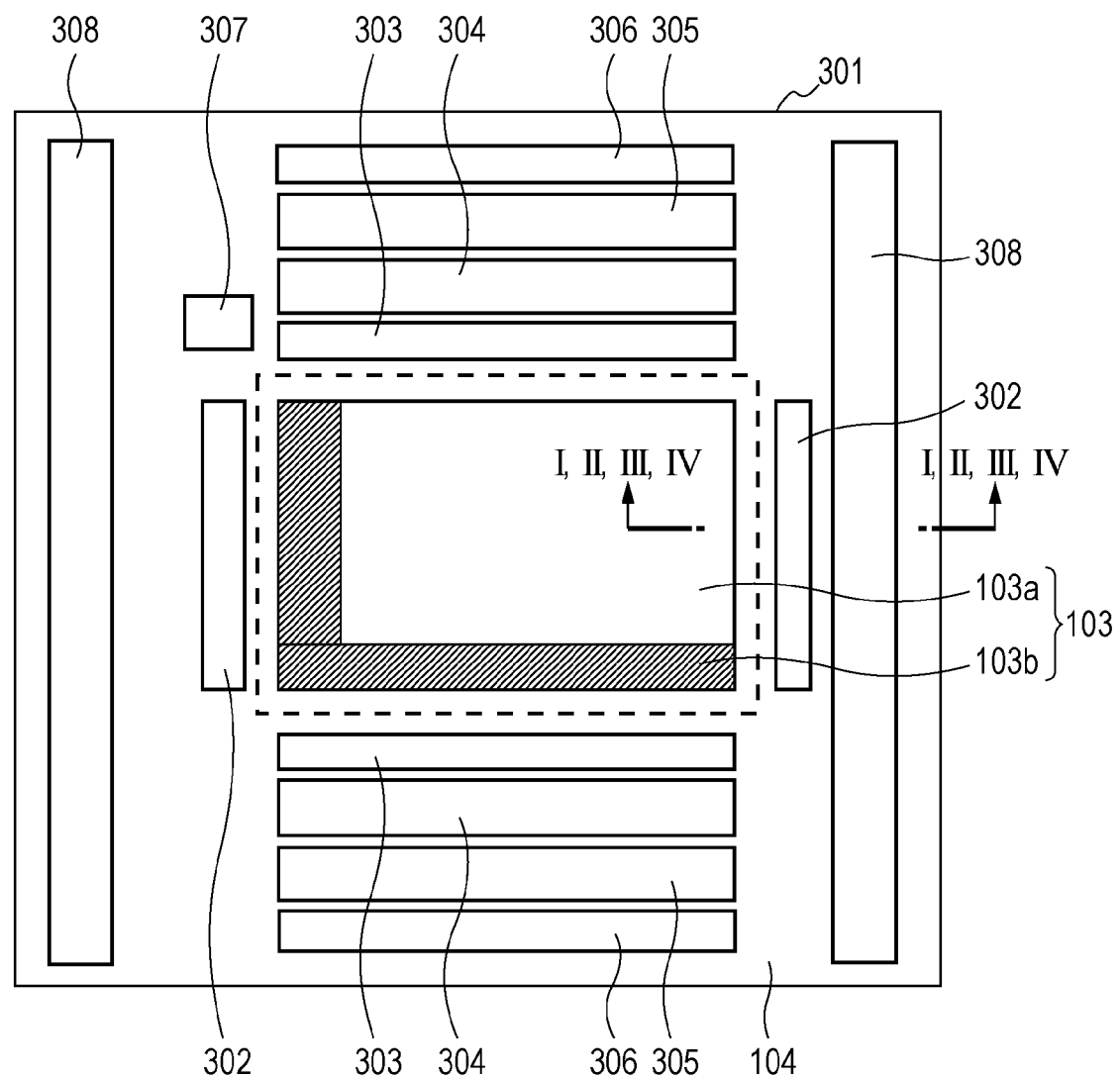
FIG. 5 is a schematic view of a planar structure of the solid-state image pickup device according to the first embodiment.

FIG. 5 is a schematic view of a planar structure of the solid-state image pickup device according to the first embodiment. A cross-section taken along a line I, II, III, IV-I, II, III, IV in FIG. 5 is illustrated in FIGS. 1A to 4C.

In FIG. 5, the solid-state image pickup device 100 includes the image pickup region 103 and the peripheral region 104. The image pickup region 103 may further include a light-receiving region 103a and a light-shielding region 103b. Many pixels are two-dimensionally arrayed in the image pickup region 103. The photoelectric conversion portions of the pixels arrayed in the light-shielding region 103b are shielded against light. Signals from the pixels in the light-shielding region 103b can be used as a reference for a black level.

The peripheral region 104 is a region other than the image pickup region 103. In this embodiment, a vertical scanning circuit 302, a horizontal scanning circuit 303, a column amplifier 304, a column ADC (Analog to Digital Converter) 305, a memory 306, a timing generator 307, and a plurality of pads 308 are disposed in the peripheral region 104. Those circuits, etc. serve to process signals from the pixels. Some of those circuits, etc. may be dispensed with.

In this embodiment, the region where the first waveguide member 118, the second waveguide member 122, and the low refractive-index member 123 are removed is denoted as a region 301 outside dotted lines in FIG. 5. The beneficial effects according to the embodiment of the present invention can be obtained when the first waveguide member 118, the second waveguide member 122, and the low refractive-index member 123 are removed in at least their parts that locate within the predetermined distance from the region where the through-hole 125 is formed.

Further, when the dielectric constant of the first waveguide member 118 is higher than that of the fifth interlayer insulating film 113e, most of the peripheral region 104 is provided as the above-mentioned region 301 as illustrated in FIG. 5. In one embodiment, the entirety of the peripheral region 104 is provided as the region 301. The reason is that the parasitic capacitance between the wirings can be reduced by removing most of the first waveguide member 118 having the high dielectric constant. Similarly, when the dielectric constant of the first waveguide member 118 is higher than that of the seventh interlayer insulating film 124, most of the peripheral region 104 is provided as the above-mentioned region 301 as illustrated in FIG. 5. In one embodiment, the entirety of the peripheral region 104 is provided as the region 301. The reason is that the parasitic capacitance between the wirings can be reduced by removing most of the first waveguide member 118 having the high dielectric constant.

With the manufacturing method according to this embodiment, it becomes easier to form the through-hole 125 in which the plug 121 is to be disposed. The reason is discussed in brief below. If the first waveguide member 118, the second waveguide member 122, and the low refractive-index member 123 are not removed before forming the seventh interlayer insulating film 124, the first waveguide member 118, the second waveguide member 122, and the low refractive-index member 123 are present between the fifth interlayer insulating film 113e and the seventh interlayer insulating film 124. Given such a structure, removing steps (e.g., etching steps) under different conditions suitable for respective layers are performed in some cases to form the through-hole 125. In contrast, by removing the first waveguide member 118, the second waveguide member 122, and the low refractive-index member 123 before forming the seventh interlayer insulating film 124 and then forming the seventh interlayer insulating film 124, the fifth interlayer insulating film 113e and the seventh interlayer insulating film 124 are disposed in contact with each other in the region where the through-hole 125 is to be formed. Thus, the step of forming the through-hole 125 can be performed with one process by using the same material to form the fifth interlayer insulating film 113e and the seventh interlayer insulating film 124. Accordingly, the through-hole 125 can be formed by two removing steps including the earlier step of removing the first waveguide member 118. As a result, the through-hole 125 can be more easily formed and the manufacturing steps are simplified.

Second Embodiment

A method of manufacturing the solid-state image pickup device, according to a second embodiment of the present invention, will be described below with reference to FIGS. 6A to 7C. It is to be noted that components in FIGS. 6A to 7C having the same functions as those in FIGS. 1A to 5 are denoted by the same reference symbols and detailed description of those components is omitted. The second embodiment differs from the first embodiment in that the second waveguide member 122 is not formed.

Figure 6A:
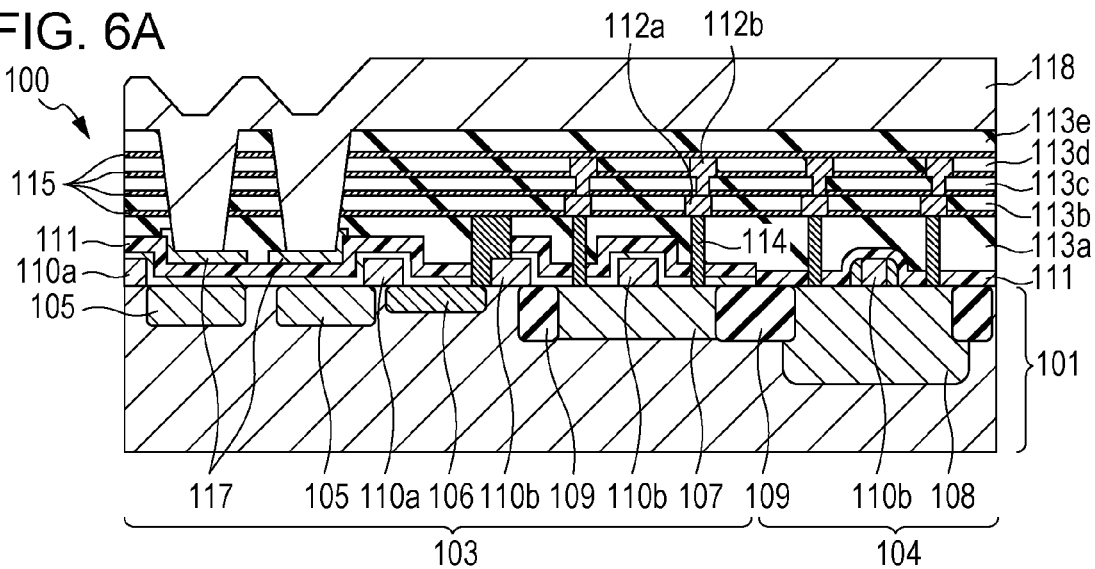
FIG. 6A illustrates a method of manufacturing a solid-state image pickup device according to a second embodiment.

FIG. 6A illustrates the same step as that illustrated in FIG. 1C regarding the first embodiment. In other words, FIG. 6A illustrates the state where the first waveguide member 118 is formed on the plural interlayer insulating films 113a to 113e in which the openings 116 are formed. Steps in the manufacturing method according to the second embodiment until the step illustrated in FIG. 6A are the same as those illustrated in FIGS. 1A to 1C regarding the first embodiment.

Figure 6B:
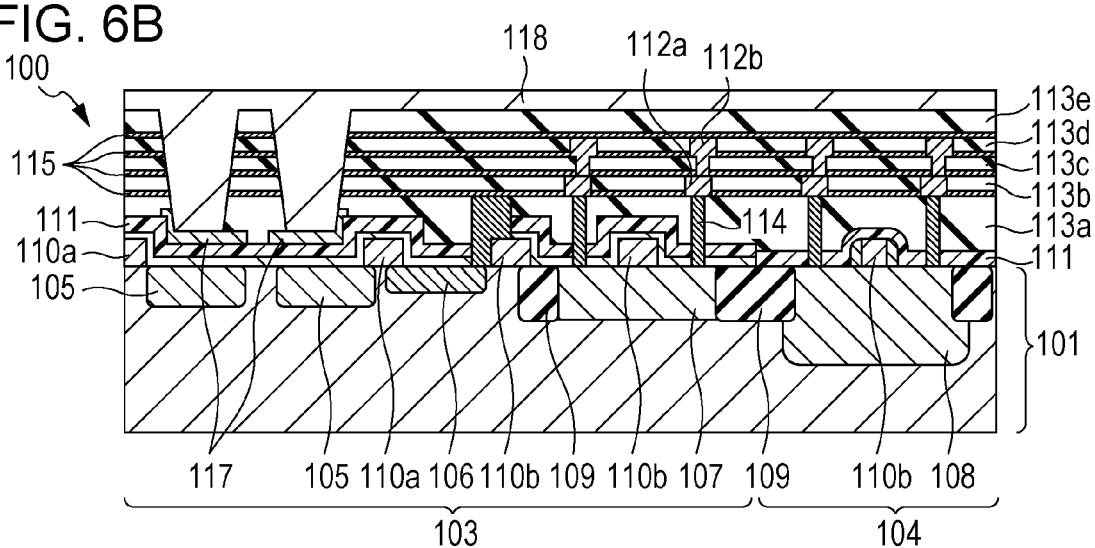
FIG. 6B illustrates the method of manufacturing the solid-state image pickup device according to the second embodiment.

In a step illustrated in FIG. 6B, the surface of the first waveguide member 118 on the side opposite to the semiconductor substrate 101 is flattened. The flattening of the first waveguide member 118 is performed by, e.g., CMP, polishing, or etching. In this embodiment, the first waveguide member 118 is flattened by CMP.

In the step illustrated in FIG. 6B, the surface of the first waveguide member 118 on the side opposite to the semiconductor substrate 101 is not required to be completely flattened. A level difference in the surface of the first waveguide member 118 on the side opposite to the semiconductor substrate 101 before the flattening is reduced by the flattening step. For example, in the peripheral region 104, a film thickness of the first waveguide member 118 after the flattening is in the range of 200 nm to 500 nm. Also, in the zone of the image pickup region 103 where the openings 116 are not disposed, a film thickness of the first waveguide member 118 after the flattening is in the range of 50 nm to 350 nm.

In this embodiment, the surface of the first waveguide member 118 on the side opposite to the semiconductor substrate 101 is exposed at the time of performing the flattening step. When another member is formed on the first waveguide member 118, an exposed surface of the other member is flattened.

Figure 6C:
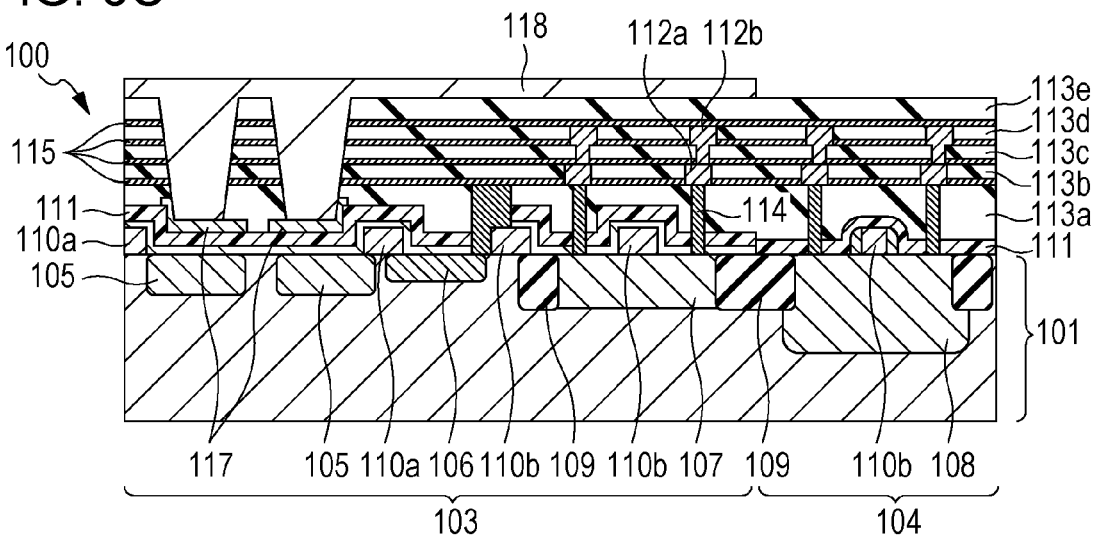
FIG. 6C illustrates the method of manufacturing the solid-state image pickup device according to the second embodiment.

After the flattening of the first waveguide member 118, in a step illustrated in FIG. 6C, a part of the first waveguide member 118, which part is formed in the peripheral region 104, is removed. Particularly, in this step the part of the first waveguide member 118, which is disposed at the position where the plug 121 is to be disposed, and which is disposed within the predetermined distance from the position where the plug 121 is to be disposed, may be removed. Thereafter, a sixth interlayer insulating film 119 is formed.

Figure 7A:
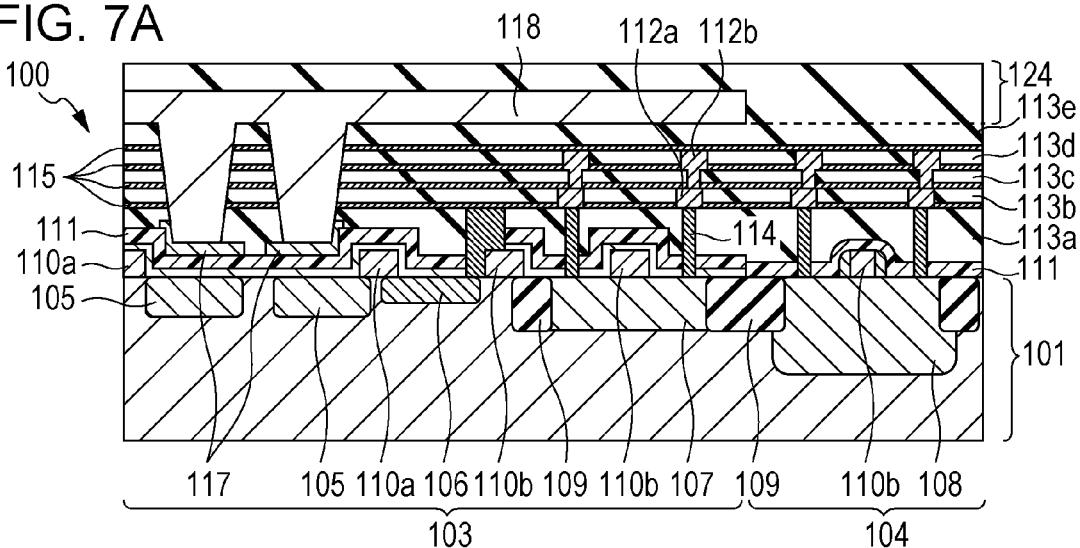
FIG. 7A illustrates the method of manufacturing the solid-state image pickup device according to the second embodiment.

Then, the seventh interlayer insulating film 124 is formed in a step illustrated in FIG. 7A. First, the seventh interlayer insulating film 124 is formed on the first waveguide member 118. The seventh interlayer insulating film 124 is formed by using the same material as that of the fifth interlayer insulating film 113e. In this embodiment, the seventh interlayer insulating film 124 is a silicon oxide film.

Figure 7B:
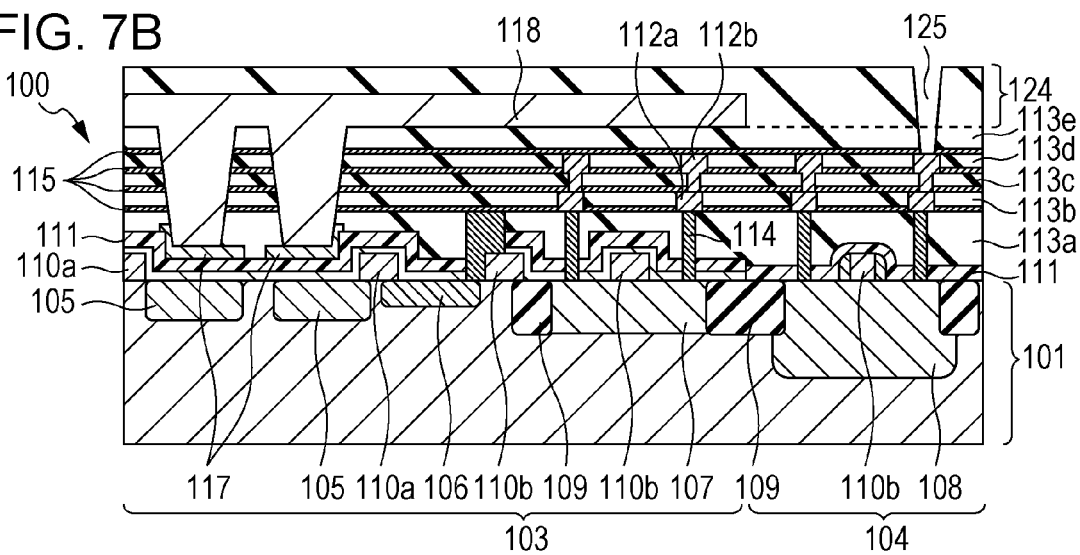
FIG. 7B illustrates the method of manufacturing the solid-state image pickup device according to the second embodiment.

In a step illustrated in FIG. 7B, the through-hole 125 is formed in which the plug 121 for electrically connecting the predetermined electroconductive member in the second wiring layer 112b and the predetermined electroconductive member in the third wiring layer 121c (formed in a later step) is to be disposed. The through-hole 125 is formed by etching the seventh interlayer insulating film 124 and the fifth interlayer insulating film 113e.

Figure 7C:
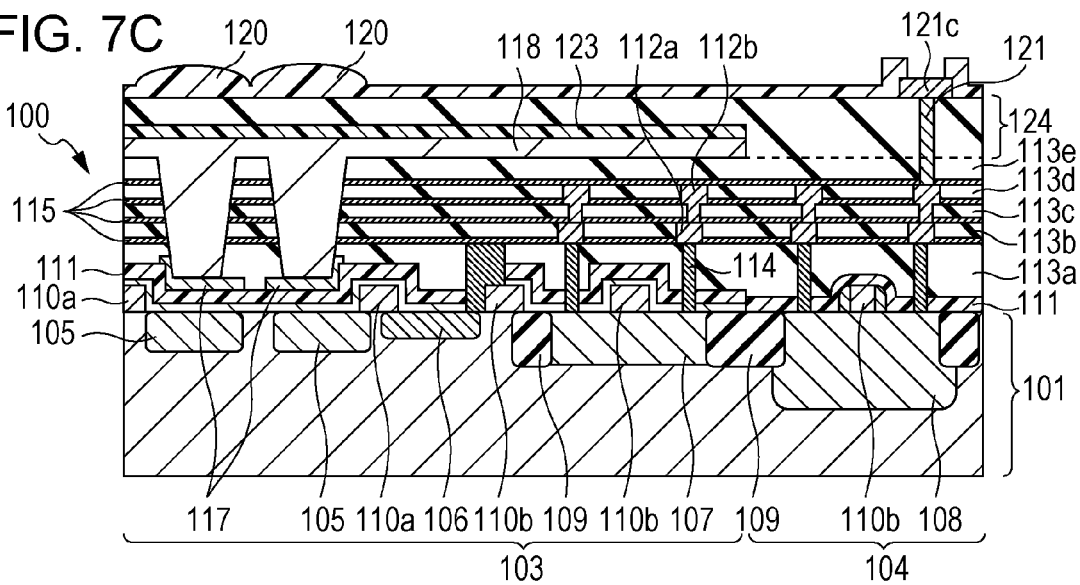
FIG. 7C illustrates the method of manufacturing the solid-state image pickup device according to the second embodiment.

In steps until obtaining the structure illustrated in FIG. 7C, the third wiring layer 121c and the in-layer lenses 120 are formed. First, the plug 121 is formed in the through-hole 125. Then, the third wiring layer 121c is formed. In this embodiment, the electroconductive member in the third wiring layer 121c is made of aluminum. The third wiring layer 121c can be formed by using, as appropriate, the manner that has been described above in the step of forming the first wiring layer 112a or the second wiring layer 112b. Next, the in-layer lenses 120 are formed. The in-layer lenses 120 are disposed respectively corresponding to the photoelectric conversion portions 105. The in-layer lenses 120 are each formed of, e.g., a silicon nitride film. The in-layer lenses 120 can be formed by using one of ordinary methods. Thereafter, color filters, microlenses, etc. are formed, above the in-layer lenses 120 on the side opposite to the semiconductor substrate 101.

By performing the above-described steps, it becomes easier to form the through-hole 125 in which the plug 121 is to be disposed. The reason is discussed in brief below. If the first waveguide member 118 is not removed before forming the seventh interlayer insulating film 124, the fifth interlayer insulating film 113e, the first waveguide member 118, and the seventh interlayer insulating film 124 are present in the state stacked in this order from the side closer to the semiconductor substrate 101. Given such a structure, three removing steps (e.g., three etching steps) under different conditions suitable for respective layers are used to form the through-hole 125. In contrast, by removing the first waveguide member 118 and then forming the seventh interlayer insulating film 124, a structure is obtained in which the fifth interlayer insulating film 113e and the seventh interlayer insulating film 124 are stacked in this order from the side closer to the semiconductor substrate 101 in the region where the through-hole 125 is to be formed. Thus, the removing step to form the through-hole 125 can be performed under the same condition by using the same material to form the fifth interlayer insulating film 113e and the seventh interlayer insulating film 124. Accordingly, the through-hole 125 can be formed by two removing steps including the earlier step of removing the first waveguide member 118.

Third Embodiment

A method of manufacturing the solid-state image pickup device, according to a third embodiment of the present invention, will be described below with reference to FIGS. 8A to 8C. It is to be noted that components in FIGS. 8A to 8C having the same functions as those in FIGS. 1A to 7C are denoted by the same reference symbols and detailed description of those components is omitted. The third embodiment differs from the second embodiment in steps after removing the part of the first waveguide member 118, which part is disposed in the peripheral region 104.

Figure 8A:
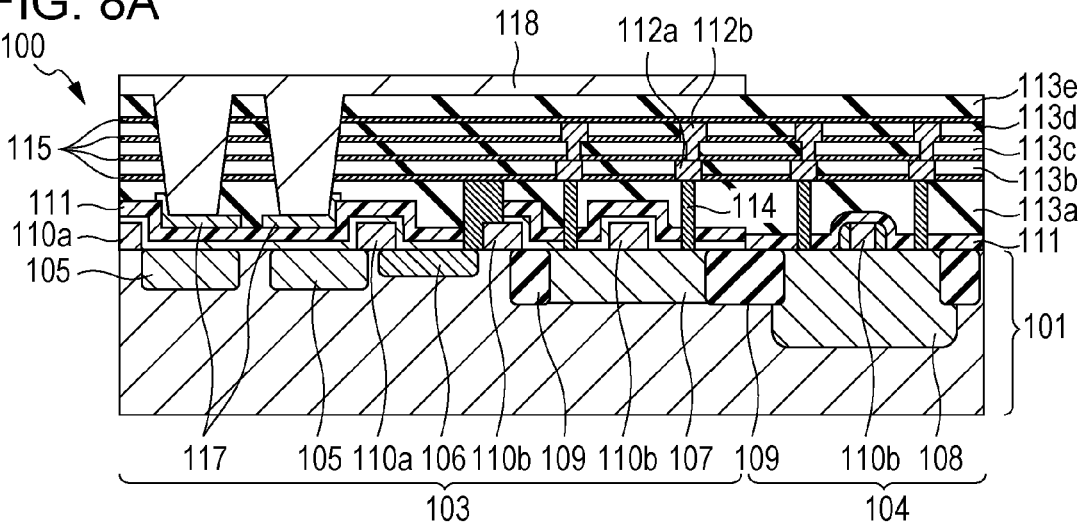
FIG. 8A illustrates a method of manufacturing a solid-state image pickup device according to a third embodiment.

FIG. 8A illustrates the same step as that illustrated in FIG. 6C regarding the second embodiment. In other words, FIG. 8A illustrates the state where the part of the first waveguide member 118, which part is disposed in the peripheral region 104, has been removed after flattening the surface of the first waveguide member 118 on the side opposite to the semiconductor substrate 101. Namely, the first waveguide member 118 is removed at least in its part corresponding to the region where the plug is to be formed in a later step, and to the region within the predetermined distance from the former region. Steps in the manufacturing method according to the third embodiment until the step illustrated in FIG. 8A are the same as those in the second embodiment until the step illustrated in FIG. 6C.

Figure 8B:
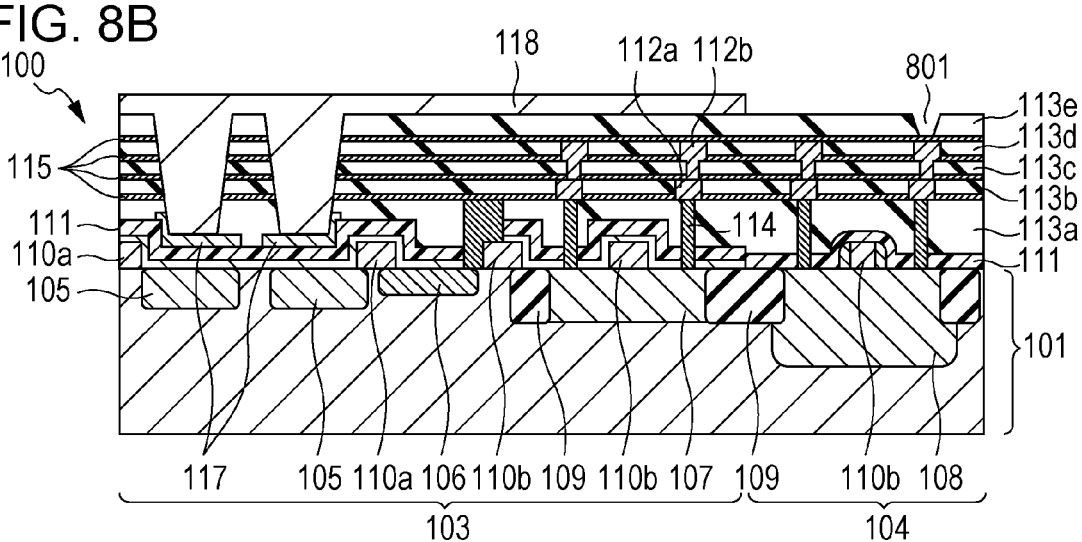
FIG. 8B illustrates the method of manufacturing the solid-state image pickup device according to the third embodiment.

In a step illustrated in FIG. 8B, a through-hole 801 is formed in the fifth interlayer insulating film 113e. The through-hole 801 is formed above the predetermined electroconductive member in the second wiring layer 112b. The through-hole 801 can be formed by using one of various methods. In this embodiment, the fifth interlayer insulating film 113e is partly removed by etching.

Figure 8C:
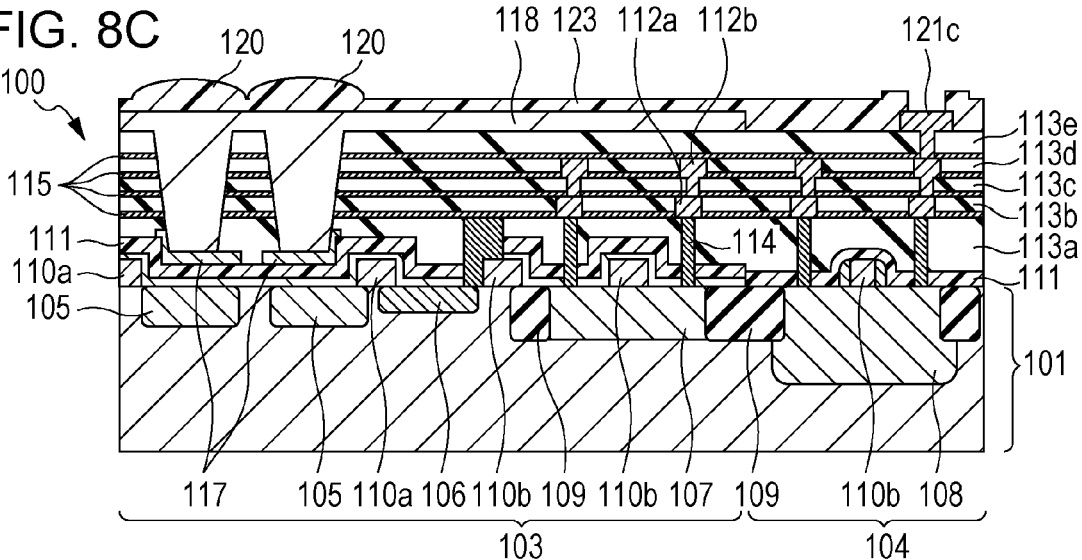
FIG. 8C illustrates the method of manufacturing the solid-state image pickup device according to the third embodiment.

In steps until obtaining the structure illustrated in FIG. 8C, the third wiring layer 121c is formed. In this embodiment, the electroconductive member in the third wiring layer 121c is made of aluminum. Alternatively, the electroconductive member in the third wiring layer 121c may be made of copper or another electroconductive material.

In this embodiment, after forming the through-hole 801, an aluminum film is formed over the entire region of the semiconductor substrate 101, and a predetermined pattern is obtained by etching. At that time, a plug disposed in the through-hole 801 and the electroconductive member in the third wiring layer 121c are formed integrally with each other. Thereafter, the in-layer lenses 120 are formed. The in-layer lenses 120 may be formed in a similar manner to that in the first embodiment or the second embodiment.

According to the third embodiment, the step of forming the seventh interlayer insulating film 124 is omitted. Further, the plug and the electroconductive member in the third wiring layer 121c are formed integral with each other. Therefore, the manufacturing steps can be further simplified.

Fourth Embodiment

Figure 9A:
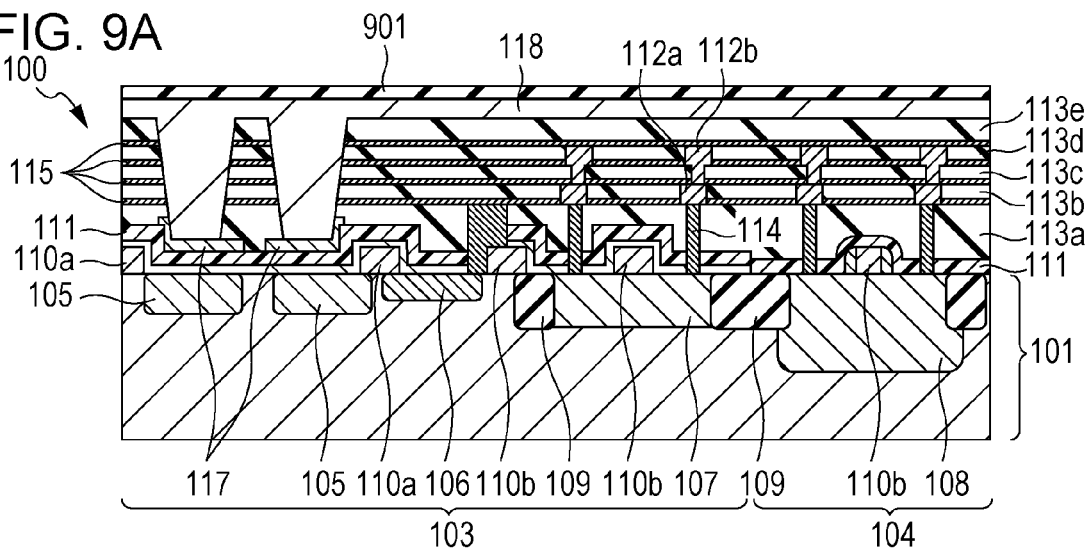
FIG. 9A illustrates a method of manufacturing a solid-state image pickup device according to a fourth embodiment.

A method of manufacturing the solid-state image pickup device, according to a fourth embodiment of the present invention, will be described below with reference to FIGS. 9A to 9C. It is to be noted that components in FIGS. 9A to 9C having the same functions as those in FIGS. 1A to 8C are denoted by the same reference symbols and detailed description of those components is omitted. In the first embodiment, the flattening step illustrated in FIG. 2C is performed after forming the second waveguide member 122. In the fourth embodiment, the flattening step is performed after forming the first waveguide member 118, and the second waveguide member 122 is then formed.

The manufacturing method according to the fourth embodiment is the same as that according to the second embodiment until the step illustrated in FIG. 6B. In the fourth embodiment, as illustrated in FIG. 9A, an insulating film 901 is formed on the first waveguide member 118 that has been flattened.

The insulating film 901 may be formed with intent to full a part of the opening 116, which part is not filled with the first waveguide member 118. In such a case, the insulating film 901 is formed by using the same material as that of the first waveguide member 118. Alternatively, the insulating film 901 may have a similar function to that of the low refractive-index member 123 in the first embodiment. Of course, the function of the insulating film 901 is not limited to the above-described function.

Figure 9B:
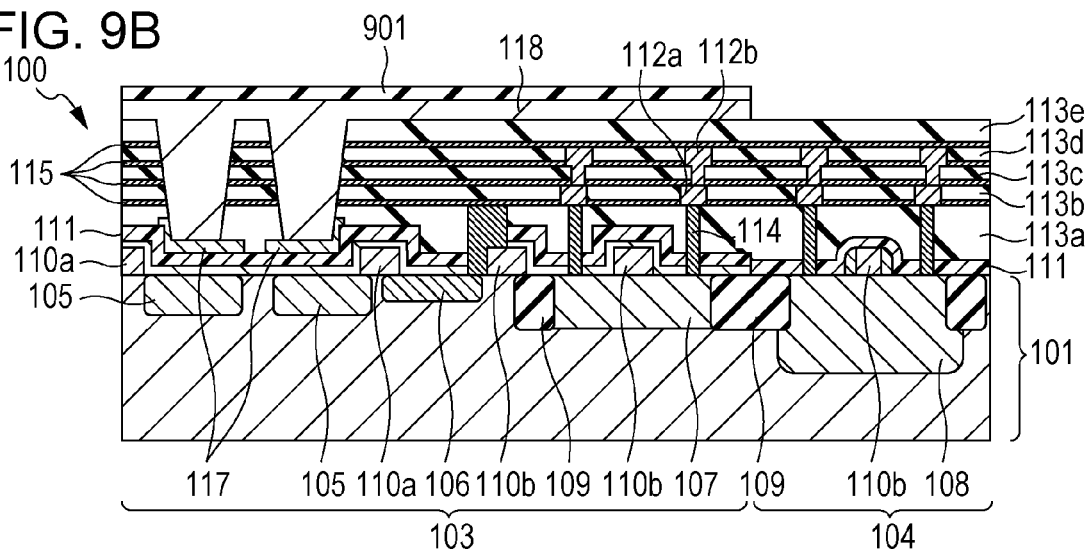
FIG. 9B illustrates the method of manufacturing the solid-state image pickup device according to the fourth embodiment.

In a step illustrated in FIG. 9B, a part of the first waveguide member 118, which part is formed in the peripheral region 104, and a part of the insulating film 901, which part is formed in the peripheral region 104, are removed. Particularly, in this step, the first waveguide member 118 and the insulating film 901 in respective parts, which are disposed at the position where the plug 121 (formed in a later step) is to be disposed, and which are disposed within the predetermined distance from the position where the plug 121 is to be disposed, is to be removed.

The removing step can be performed by using one of ordinary methods. In this embodiment, the respective parts of the first waveguide member 118 and the insulating film 901, which parts are formed in the peripheral region 104, are removed by etching, for example.

Figure 9C:
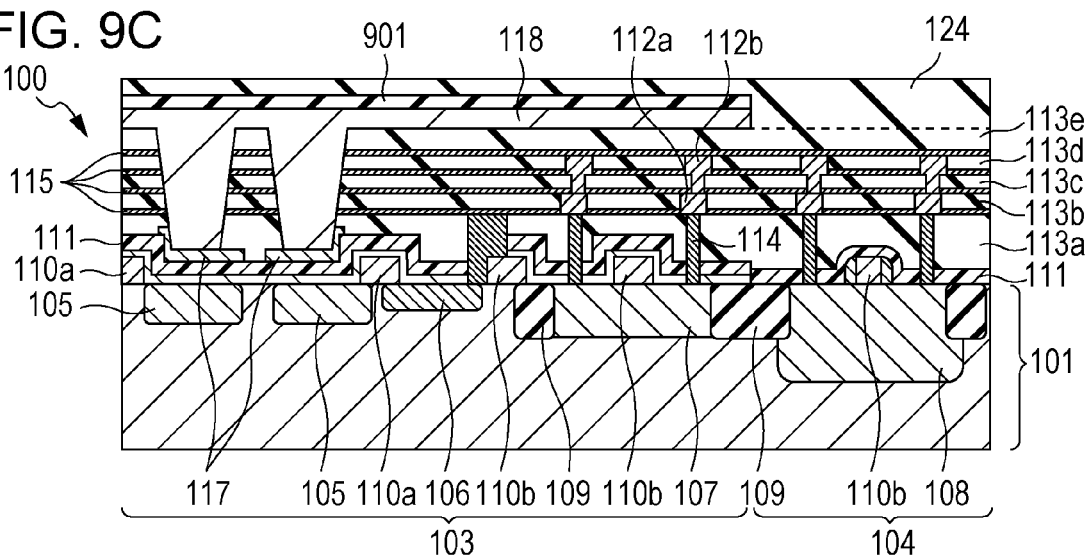
FIG. 9C illustrates the method of manufacturing the solid-state image pickup device according to the fourth embodiment.

In a step illustrated in FIG. 9C, the seventh interlayer insulating film 124 is formed. The seventh interlayer insulating film 124 is formed by using the same material as that of the fifth interlayer insulating film 113e. A surface of the seventh interlayer insulating film 124 on the side opposite to the semiconductor substrate 101 may be flattened.

Subsequent steps may be performed, as appropriate, in a similar manner to that described above in the first embodiment with reference to FIGS. 4A to 4C.

Fifth Embodiment

Figure 10:
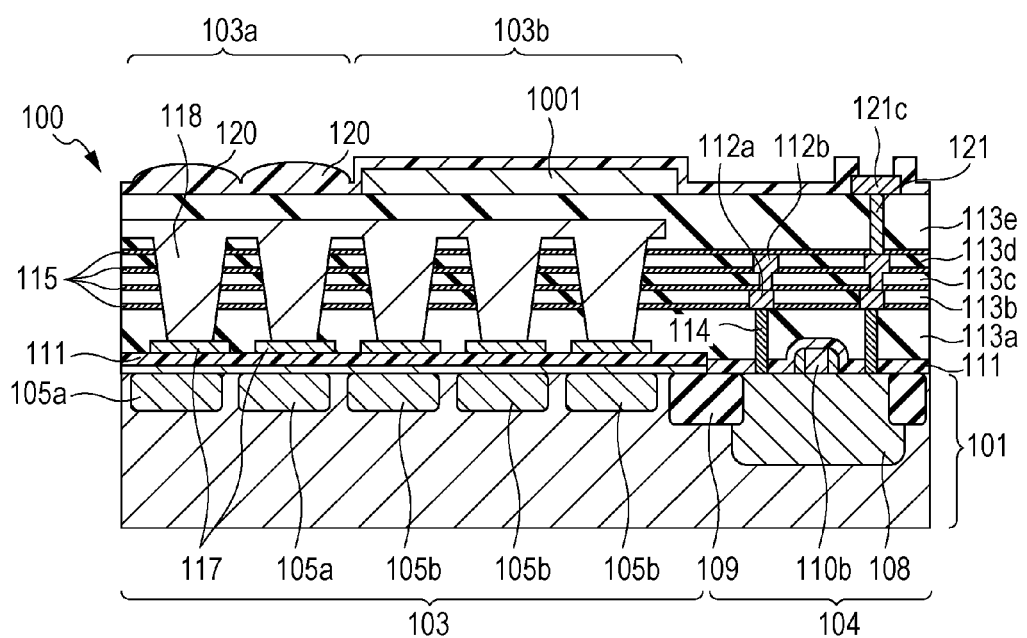
FIG. 10 is a schematic view of a cross-sectional structure of a solid-state image pickup device according to a fifth embodiment.

Another example of the solid-state image pickup device to which the method of manufacturing the solid-state image pickup device, according to the embodiment of the present invention, is applicable will be described below as a fifth embodiment with reference to FIG. 10. It is to be noted that components in FIG. 10 having the same functions as those in FIGS. 1A to 9C are denoted by the same reference symbols and detailed description of those components is omitted.

In the fifth embodiment, the image pickup region 103 includes a light-receiving region (effective pixel region) 103a and a light-shielding region (optical black pixel region) 103b. An opening 116 is formed corresponding to each of photoelectric conversion portions 105a disposed in the light-receiving region 103a and photoelectric conversion portions 105b disposed in the light-shielding region 103b. A first waveguide member 118 is filled in the opening 116. Thus, optical waveguides are individually formed for the photoelectric conversion portions 105a and the photoelectric conversion portions 105b.

A light-shielding member 1001 is disposed in the light-shielding region 103b. The light-shielding member 1001 is positioned on the side opposite to the semiconductor substrate 101 with respect to the first waveguide member 118. At least part of light incident on the photoelectric conversion portion 105b is shielded by the light-shielding member 1001. The light incident on the photoelectric conversion portion 105b is all shielded by the light-shielding member 1001. Oblique incident light, etc. may enter the photoelectric conversion portion 105b disposed in the light-shielding region 103b. The light-shielding member 1001 is just used to have the function of, when the entire surface of the image pickup region 103 is irradiated with a uniform quantity of light, reducing the quantity of light incident on the photoelectric conversion portion 105b in comparison with the quantity of light incident on the photoelectric conversion portion 105a.

In this embodiment, the light-shielding member 1001 is made of aluminum. The light-shielding member 1001 may be included in the same layer as the third wiring layer 121c. Stated another way, the light-shielding member 1001 is made of the same material as that of the electromagnetic member included in the third wiring layer 121c. From the viewpoint of the manufacturing method, the light-shielding member 1001 is formed at the same time as when the electromagnetic member included in the third wiring layer 121c is formed. The method of forming the light-shielding member 1001 is not limited to the above-described one, and it can be optionally selected from various methods.

In this embodiment, of the first waveguide member 118 disposed in the peripheral region 104, at least parts which are disposed at the position where the plug 121 is disposed and which are disposed within the predetermined distance from the position where the plug 121 is disposed are removed. On the other hand, a part of the first waveguide member 118, which part is disposed in the light-shielding region 103b, is not removed. However, the structure that the part of the first waveguide member 118, disposed in the light-shielding region 103b, is not removed is merely one example. The part of the first waveguide member 118, disposed in the light-shielding region 103b, may be removed.

Sixth Embodiment

Still another example of the solid-state image pickup device to which the method of manufacturing the solid-state image pickup device, according to the embodiment of the present invention, is applicable will be described below as a sixth embodiment with reference to FIGS. 11A to 11C. It is to be noted that components in FIGS. 11A to 11C having the same functions as those in FIGS. 1A to 10 are denoted by the same reference symbols and detailed description of those components is omitted.

Figure 11A:
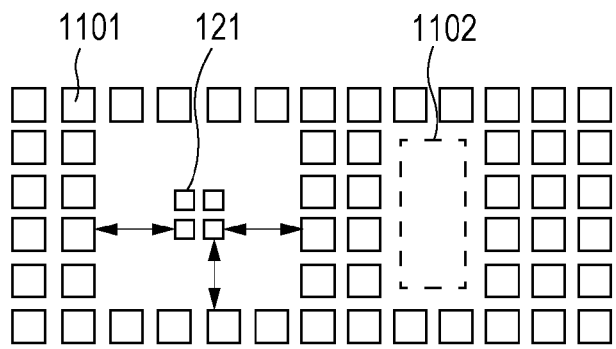
FIG. 11A is a schematic view of one planar structure of a solid-state image pickup device according to a sixth embodiment.
Figure 11B:
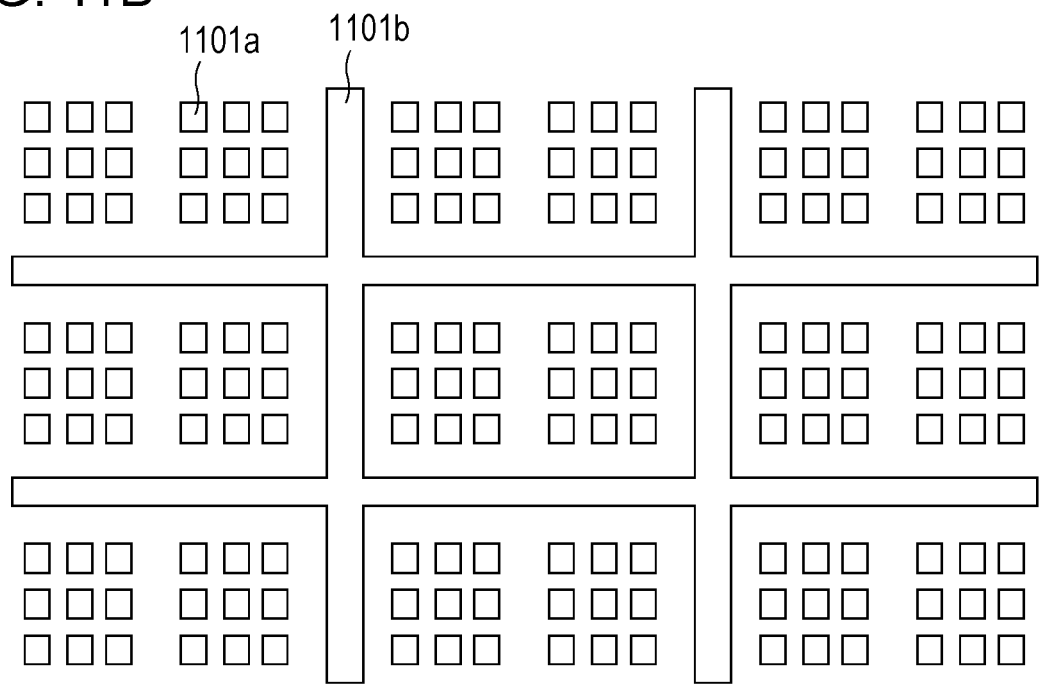
FIG. 11B is a schematic view of another planar structure of the solid-state image pickup device according to the sixth embodiment.
Figure 11C:
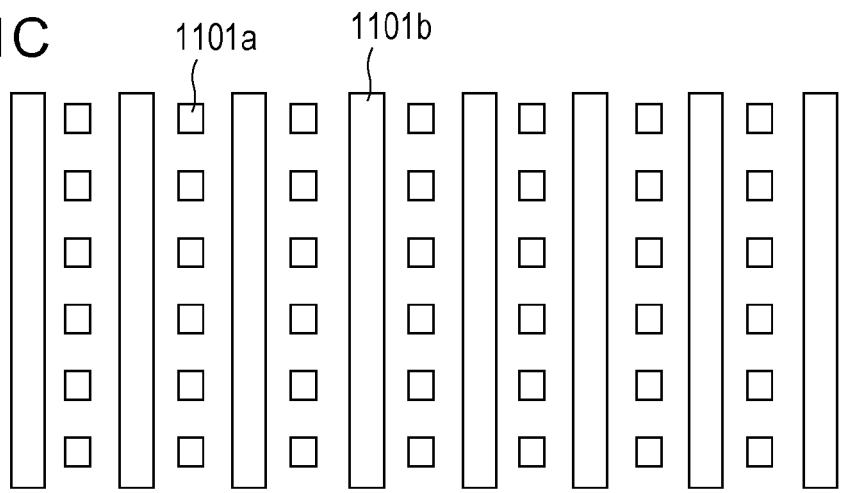
FIG. 11C is a schematic view of still another planar structure of the solid-state image pickup device according to the sixth embodiment.

FIGS. 11A to 11C are schematic views of a planar structure of the solid-state image pickup device according to the sixth embodiment. In the sixth embodiment, some parts of the first waveguide member 118 disposed in the peripheral region 104 are removed, while the other part of the first waveguide member 118 is not removed. In this embodiment, the first waveguide member 118 is removed at least from not only the region where the plug 121 is disposed, but also the region within the predetermined distance from the region where the plug 121 is disposed. The predetermined distance is denoted by an arrow in FIG. 11A. The predetermined distance may be determined on the basis of, e.g., the planar size of the plug.

In the region where the first waveguide member 118 is not removed, as illustrated in FIG. 11A, the first waveguide member 118 is disposed as a pattern 1101. The pattern 1101 is disposed in the form of dots in the region spaced by a distance longer than a predetermined value from the region where the plug 121 is disposed. A region 1102 where the pattern 1101 is not disposed may exist in the region spaced by a distance longer than the predetermined value from the region where the plug 121 is disposed. In one embodiment, the pattern 1101 is not disposed, for example, in a portion where the electromagnetic member in the second wiring layer and the electromagnetic member in the third wiring layer overlap with each other. This is because an increase of parasitic capacitance can be suppressed with the arrangement that the first waveguide member 118 having a high dielectric constant is not disposed. The expression "the first waveguide member 118 having a high dielectric constant" implies that the first waveguide member 118 has a higher dielectric constant than that of any other member disposed between the electromagnetic member in the second wiring layer and the electromagnetic member in the third wiring layer.

When the first waveguide member 118 is removed, this implies, for example, that the fifth interlayer insulating film 113e is exposed at least immediately after the step of removing the first waveguide member 118. On the other hand, when the first waveguide member 118 is not removed, this implies, for example, that the fifth interlayer insulating film 113e, which is disposed on the side closer to the semiconductor substrate 101 with respect to the first waveguide member 118 and which is in contact with the first waveguide member 118, is not exposed.

FIGS. 11B and 11C illustrate variations of the pattern 1101 in a plan view. The pattern 1101 may be constituted by appropriately combining a dot pattern 1101a and a line pattern 1101b with each other.

Further, a level difference between the image pickup region 103 and the peripheral region 104 can be reduced by leaving the first waveguide member 118 partly in the peripheral region 104. When the first waveguide member 118 disposed in the peripheral region 104 is entirely removed, a level difference may be caused between the image pickup region 103 and the peripheral region 104, for example after forming the seventh interlayer insulating film 124. In such a case, there is a possibility that the level difference therebetween is not sufficiently eliminated even after the subsequent flattening step. The level difference can be reduced by appropriately setting a proportion of the regions where the first waveguide member 118 is left, with respect to the entire peripheral region 104.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-026355 filed Feb. 9, 2011, which is hereby incorporated by reference herein in its entirety.

What is claimed is:

1. A semiconductor device manufacturing method comprising:
    a first step of, after preparing a semiconductor substrate including a first region where a plurality of photoelectric conversion portions is disposed and a second region where a circuit for processing signals is disposed, forming a first conductive member on the second region;
    a second step of forming a first insulator which includes a first part disposed on the first region and a second part disposed on the second region, wherein the first insulator is formed on the first conductive member;
    a third step of forming a first opening in the first part of the first insulator, while the first insulator is left at a position where a plug connected to the first conductive member is to be disposed;
    a fourth step of forming a second insulator, which is made of a material different from a material of the first insulator, inside the first opening and on the second part of the first insulator;
    a fifth step of removing first and second parts of the second insulator such that the first insulator is exposed, both of the first and second parts of the second insulator being disposed on the second region, the first part of the second insulator being disposed correspondingly to a position where the plug is to be disposed, and the second part of the second insulator being disposed within a predetermined distance from the first part of the second insulator;
    a sixth step of, after the fifth step, forming a second opening in the first insulator at the position where the plug is to be disposed; and
    a seventh step of forming the plug in the second opening, wherein an area of the second opening is smaller than an area of the first and second parts of the second insulator, which are removed in the fifth step, and
    the method further comprises, between the fourth and fifth steps, a step of flattening the second insulator.

2. The method according to claim 1, further comprising:
after the fifth step, forming a third insulator on the second insulator and on the second part of the first insulator,
wherein, in the sixth step, the second opening is formed in the third insulator at the position where the plug is to be disposed.

3. The method according to claim 2, wherein the first insulator and the third insulator are made of a same material.

4. The method according to claim 1, further comprising:
between the fourth step and the fifth step, forming a fourth insulator on the second insulator,
wherein, in the fifth step, first and second parts of the fourth insulator are removed such that the first insulator is exposed, both of the first and second parts disposed at the position on the first conductive member, the first part of the fourth insulator where the plug is to be disposed, and the second part of the fourth insulator being disposed within the predetermined distance from the first part of the fourth insulator.

5. The method according to claim 1, wherein an entirety of the second insulator on the second region is removed in the fourth step such that an entirety of the first insulator on the second region is exposed.

6. The method according to claim 1, wherein at least a third part other than the first and second parts of the second insulator is left on the first insulator after the fourth step.

7. The method according to claim 1, wherein the first insulator includes a plurality of insulating films, and
in the third step, the first opening is formed so as to penetrate through the plurality of insulating films.

8. The method according to claim 1, further comprising:
a step of forming a second conductive member that is connected to the plug and that is disposed on one side of the first conductive member opposite to the semiconductor substrate,
wherein the step of forming the second conductive member includes a step of forming a film of a material that constitutes the second conductive member, and a step of etching the film by using a mask pattern for the etching, the mask pattern being disposed on the film.

9. A semiconductor device manufacturing method comprising:
a first step of, after preparing a semiconductor substrate including a first region where a plurality of photoelectric conversion portions is disposed, and a second region where a circuit for processing signals is disposed, forming a first conductive member on the second region;
a second step of forming a first insulator which includes a first part disposed on the first region and a second part disposed on the second region, wherein the first insulator is formed on the first conductive member;
a third step of forming a first openings in the first part of the first insulator, while the first insulator is left at a position where a plug connected to the first conductive member is to be disposed;
a fourth step of forming a second insulator, which is made of a material different from a material of the first insulator, inside the first openings and on the second part of the first insulator;
a fifth step of removing first and second parts of the second insulator such that the first insulator is exposed, both of the first and second parts of the second insulator being disposed on the second region, the first part of the second insulator being disposed correspondingly to a position where the plug is to be disposed, and the second part of the second insulator being disposed within a predetermined distance from the first part of the second insulator;
a sixth step of, after the fifth step, forming a second opening in the first insulator at the position where the plug is to be disposed; and
a seventh step of forming the plug in the second opening,
wherein an area of the second opening is smaller than an area of the first and second parts of the second insulator, which are removed in the fifth step,
wherein the method further comprises, in the fourth step, forming a fourth insulator on the second insulator,
the method further comprises, between the fourth and fifth steps, a step of flattening the fourth insulator.

10. The method according to claim 9, further comprising:
after the fifth step, forming a third insulator on the second insulator and on the second part of the first insulator disposed on the second region,
wherein, in the sixth step, the second opening is formed in the third insulator at the position where the plug is to be disposed.

11. The method according to claim 10, wherein the first insulator and the third insulator are made of a same material.

12. The method according to claim 9,
wherein, in the fifth step, first and second parts of the fourth insulator are removed such that the first insulator is exposed, both of the first and second parts disposed on the second part of the first insulator, the first part of the fourth insulator being disposed correspondingly to a position where the plug is to be disposed, and the second part of the fourth insulator being disposed within the predetermined distance from the first part of the fourth insulator.

13. The method according to claim 9, wherein an entirety of the second insulator on the second region is removed in the fourth step such that an entirety of the first insulator on the second region is exposed.

14. The method according to claim 9, wherein at least a third part other than the first and second parts of the second insulator is left on the first insulator after the fourth step.

15. The method according to claim 9, wherein the first insulator includes a plurality of insulating films, and
in the third step, the first opening is formed so as to penetrate through the plurality of insulating films.

16. The method according to claim 9, further comprising:
a step of forming a second conductive member that is connected to the plug and that is disposed on one side of the first conductive member opposite to the semiconductor substrate,
wherein the step of forming the second conductive member includes a step of forming a film of a material that constitutes the second conductive member, and a step of etching the film by using a mask pattern for the etching, the mask pattern being disposed on the film.

17. A semiconductor device manufacturing method comprising:
a first step of, after preparing a semiconductor substrate including a first region where a plurality of photoelectric conversion portions is disposed, and a second region where a circuit for processing signals is disposed, forming an conductive member on the second region;
a second step of forming a first insulator which includes a first part disposed on the first region and a second part disposed on the second region, wherein the first insulator is formed on the conductive member;

a third step of forming a first opening in the first part of the first insulator, while the first insulator is left at a position where a plug connected to the conductive member is to be disposed;

a fourth step of forming a second insulator, which is made of a material different from a material of the first insulator, inside the first openings and on the second part of the first insulator;

a fifth step of removing first and second parts of the second insulator, both of the first and second parts of the second insulator being disposed on the second region, the first part of the second insulator being disposed correspondingly to a position where the plug is to be disposed, and the second part of the second insulator being disposed within a predetermined distance from the first part of the second insulator;

a sixth step of, after the fifth step, forming a third insulator on the second insulator and on the second part of the first insulator, a seventh step of, after the sixth step, forming a second opening in the first insulator at the position where the plug is to be disposed, and in the third insulator at the position where the plug is to be disposed; and an eighth step of forming the plug in the second opening, wherein an area of the second opening is smaller than an area of the first and second parts of the second insulator, which part is removed in the fifth step, wherein the first insulator and the third insulator are made of a same material, and wherein the first insulator and the third insulator are formed in contact with each other.

* * * * *